US009690751B2

(12) United States Patent
Noguchi

(10) Patent No.: US 9,690,751 B2
(45) Date of Patent: Jun. 27, 2017

(54) DIGITAL PROCESSING APPARATUS AND DIGITAL PROCESSING METHOD

(71) Applicant: NEC Corporation, Minato-ku, Tokyo (JP)

(72) Inventor: Hidemi Noguchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/914,763

(22) PCT Filed: Aug. 20, 2014

(86) PCT No.: PCT/JP2014/004259
§ 371 (c)(1),
(2) Date: Feb. 26, 2016

(87) PCT Pub. No.: WO2015/033524
PCT Pub. Date: Mar. 12, 2015

(65) Prior Publication Data
US 2016/0203104 A1   Jul. 14, 2016

(30) Foreign Application Priority Data

Sep. 4, 2013 (JP) ................... 2013-182854

(51) Int. Cl.
*G06F 17/14* (2006.01)
*H03H 17/02* (2006.01)
*H04L 25/03* (2006.01)

(52) U.S. Cl.
CPC ......... *G06F 17/14* (2013.01); *H03H 17/0213* (2013.01); *H03H 17/0226* (2013.01); *H03H 17/0227* (2013.01); *H04L 25/03057* (2013.01)

(58) Field of Classification Search
CPC ............... G06F 17/14; H03H 17/0226; H03H 17/0213; H03H 17/0227; H04L 25/03057
See application file for complete search history.

(56) References Cited

U.S. PATENT DOCUMENTS 8,976,852 B2 * 3/2015 Huang .............. H03M 13/2957
375/224
9,281,801 B2 * 3/2016 Shibayama ........ H03H 17/0213
(Continued)

FOREIGN PATENT DOCUMENTS

JP    H06-252699 A    9/1994
JP    2007-151046 A    6/2007
(Continued)

OTHER PUBLICATIONS

International Search Report for PCT Application No. PCT/JP2014/004259, mailed on Oct. 14, 2014.
(Continued)

*Primary Examiner* — Dac Ha

(57) ABSTRACT

In order to enhance the speed of a processing necessary for setting the factor of a filter and further maintain the accuracy of the filter, a digital processing apparatus includes: a Fourier transform unit that Fourier transforms a time domain digital signal, thereby generating N frequency domain signals; a filter unit that uses N first factors to process the frequency domain signals in the frequency domain; an inverse Fourier transform unit that transforms the frequency domain signals as processed by the filer unit to a time domain digital signal; a low accuracy factor calculation unit that uses m second factors to calculate N first A factors; a high accuracy factor calculation unit that includes a factor division unit for calculating respective ratios of N third factors to the N first A factors and that also includes a factor variable unit for calculating N first B factors varying stepwise from one to the respective ratios; a multiplication unit that multiplies the first A factors by the first B factors, thereby calculating the N first factors; and a control unit that controls the low accuracy factor calculation unit and high accuracy factor calculation unit by causing only the low accuracy factor calculation unit to operate with the first B (Continued)

factors being set to one and thereafter causing the high accuracy factor calculation unit to calculate the first B factors based on the third factors.

20 Claims, 18 Drawing Sheets

(56) References Cited

U.S. PATENT DOCUMENTS

2003/0227842 A1 12/2003 Shim et al.
2010/0046599 A1* 2/2010 Kim .................. H04L 25/0224
                                               375/233

FOREIGN PATENT DOCUMENTS

| JP | 2007-300313 A | 11/2007 |
| JP | 2008-205654 A | 9/2008 |
| JP | 2010-057016 A | 3/2010 |
| WO | 2013/008347 A1 | 1/2013 |

OTHER PUBLICATIONS

English translation of Written opinion for PCT Application No. PCT/JP2014/004259.

Seb J. Savory, "Digital filters for coherent optical receivers", Optics Express, vol. 16, No. 2, p. 804-817 (Jan. 2008).

M. Kuschnerov, F. N. Hauske, K. Piyawanno, B. Spinnler, A. Napoli, and B. Lankl, "Adaptive Chromatic Dispersion Equalization for Non-Dispersion Managed Coherent Systems", in Optical Fiber Communication Conference, OSA Technical Digest (Optical Society of America, 2009), paper OMT1.

Lijun Sun et al., A Novel Frequency Domain Equalization Algorithm for SC-FDE System, 2009, Pacific-Asia Conference on Knowledge Engineering and Software Engineering (KESE. 2009), Dec. 2009, pp. 132-135. Abstract only.

* cited by examiner

DIGITAL PROCESSING APPARATUS AND DIGITAL PROCESSING METHOD

This application is a National Stage Entry of PCT/JP2014/004259 filed on Aug. 20, 2014, which claims priority from Japanese Patent Application 2013-182854 filed on Sep. 4, 2013, the contents of all of which are incorporated herein by reference, in their entirety.

TECHNICAL FIELD

The present invention relates to a digital processing apparatus, a digital processing method, and a digital processing program, in particular, to a digital processing apparatus, a digital processing method, and a digital processing program for performing equalization processing on a signal in a receiving apparatus.

BACKGROUND ART

Digital signals are transmitted and received in a recent optical communication system and a recent radio communication system. A receiving apparatus for a digital signal may compensate a waveform distortion using a digital filter on the received digital signal in many cases (for example, refer to PTL (patent literature) 1 and NPL (non-patent literature) 1).

In compensation of a waveform distortion, an FDE (frequency-domain equalization) circuit may be used for compensating a waveform distortion using a digital filter in a frequency domain after Fourier-transforming a received signal. PTL 2 describes an FDE circuit using a digital filter. FIG. 18 is a block diagram illustrating a configuration of an FDE circuit relevant to the present invention, described in PTL 2. An FDE circuit 990 includes a Fourier transform unit 991, a filter unit 992, and an inverse Fourier transform unit 993. The Fourier transform unit 991 Fourier-transforms an input digital signal Din(t), and outputs N signals with frequency components of 0 to (N−1) $\Delta\omega_s$. The filter unit 992 performs waveform equalization processing in a frequency domain by multiplying these Fourier-transformed digital signals by filter factors. The output of the filter unit 992 is inverse-Fourier-transformed in the inverse Fourier transform unit 993. The inverse Fourier transform unit 993 outputs a digital signal with shaped waveform as an output signal Dout(t).

Furthermore, NPL 2 describes a procedure for controlling an FDE circuit by switching filter factors in semi-fixed manner using a look-up table (LUT) to compensate wavelength dispersion.

CITATION LIST

Patent Literature

[PTL1]: Japanese Laid-open Patent Publication No. 2008-205654 (paragraph [0051] and FIG. 2)
[PTL2]: Japanese Laid-open Patent Publication No. 2010-057016 (paragraph [0045] and FIG. 10)

Non Patent Literature

[NPL1]: Seb J. Savory, "Digital filters for coherent optical receivers", Optics Express, Vol. 16, No. 2, p. 804-817 (January 2008).
[NPL2]: M. Kuschnerov, F. N. Hauske, K. Piyawanno, B. Spinnler, A. Napoli, and B. Lankl, "Adaptive Chromatic Dispersion Equalization for Non-Dispersion Managed Coherent Systems", in Optical Fiber Communication Conference, OSA Technical Digest (Optical Society of America, 2009), paper OMT1.

SUMMARY OF INVENTION

Technical Problem

With explosive increase of the Internet traffic, an increase of capacity in a communication system is required. In a large capacity communication system, when performing filter processing adaptively depending on a characteristic of a transmission line or in other cases, it may be necessary to switch characteristics of a filter at high speed during communication.

However, when a capacity of the communication system becomes large, a size of a Fourier transform circuit increases in an FDE circuit performing waveform equalization processing previously mentioned, and with this increase, the number of the factors of a digital filter to be set also increases. In the FDE circuit 990 illustrated in FIG. 18, when the number of factors of a digital filter increases, an amount of processing required for setting factors increases, which makes it difficult to perform high-speed factor control. On the other hand, in the FDE circuit 990, when attempting to speed up waveform equalization processing by simplification of setting filter factors, there is a possibility that accuracy of a filter may decrease. Due to the decrease of accuracy of a filter, a desired filter characteristic may not be achieved. Therefore, with increase of capacity in the communication system, both speed-up of factor control for a digital filter and improvement of accuracy of a filter are required. However, the techniques described in PTLs 1 and 2 and NPLs 1 and 2 may not achieve both speed-up of factor control for a digital filter and improvement of accuracy of a filter.

The above-mentioned problem may happen not only in a FDE circuit compensating waveform distortion but also in a general digital filter required for high-speed control of a factor of a filter and improvement of accuracy of a filter.

An object of the present invention is to provide a digital processing apparatus, a digital processing method, and a digital processing program which can enhance a speed of processing required for setting a factor of a filter while maintaining accuracy of the filter.

Solution to Problem

A digital processing apparatus of the present invention includes:
Fourier transform means for Fourier-transforming a time domain digital signal to generate N frequency domain signals (where N is a natural number);
filter means for processing the frequency domain signals in a frequency domain using N first factors;
inverse Fourier transform means for transforming the frequency domain signals processed by the filter means into a time domain digital signal;
low accuracy factor calculation means for calculating N first A factors using m second factors (where N>m and m is a natural number);
high accuracy factor calculation means including factor division means for calculating respective ratios of N third factors and the N first A factors and factor variable means for calculating N first B factors that change in a stepwise fashion from 1 to the respective ratios;

multiplication means for calculating the N first factors by multiplying the first A factors and the first B factors; and control means for controlling the low accuracy factor calculation means and the high accuracy factor calculation means so that the high accuracy factor calculation means calculates the first B factors based on the third factors after causing only the low accuracy factor calculation means to operate with the first B factors being set to 1.

A digital processing method of the present invention includes:

Fourier-transforming a time domain digital signal to generate N frequency domain signals (where N is a natural number);

processing the frequency domain signals in a frequency domain using N first factors;

transforming the processed frequency domain signals into a time domain digital signal;

calculating N first A factors using m second factors (where N>m and m is a natural number);

calculating respective ratios of N third factors and the N first A factors;

calculating N first B factors that change in a stepwise fashion from 1 to the respective ratios; and calculating the first A factors as the first factors and thereafter, calculating the first factors by multiplying the first A factors and the first B factors based on the third factors.

A non-transitory storage medium storing a digital processing program, the digital processing program causing a computer of a digital processing apparatus to execute:

a procedure of Fourier-transforming a time domain digital signal to generate N frequency domain signals (where N is a natural number);

a procedure of processing the frequency domain signals in a frequency domain using N first factors;

a procedure of transforming the processed frequency domain signals into a time domain digital signal;

a procedure of calculating N first A factors using m second factors (where N>m and m is a natural number);

a procedure of calculating respective ratios of N third factors and the N first A factors;

a procedure of calculating N first B factors that change in a stepwise fashion from 1 to the respective ratios; and a procedure of calculating the first A factors as the first factors and thereafter, calculating the first factors by multiplying the first A factors and the first B factors based on the third factors.

Advantageous Effects of Invention

The digital processing apparatus, the digital processing method, and the digital processing program according to the present invention can set a factor of a filter at high speed while achieving high accuracy of the filter.

DESCRIPTION OF EMBODIMENTS

Figure 1:
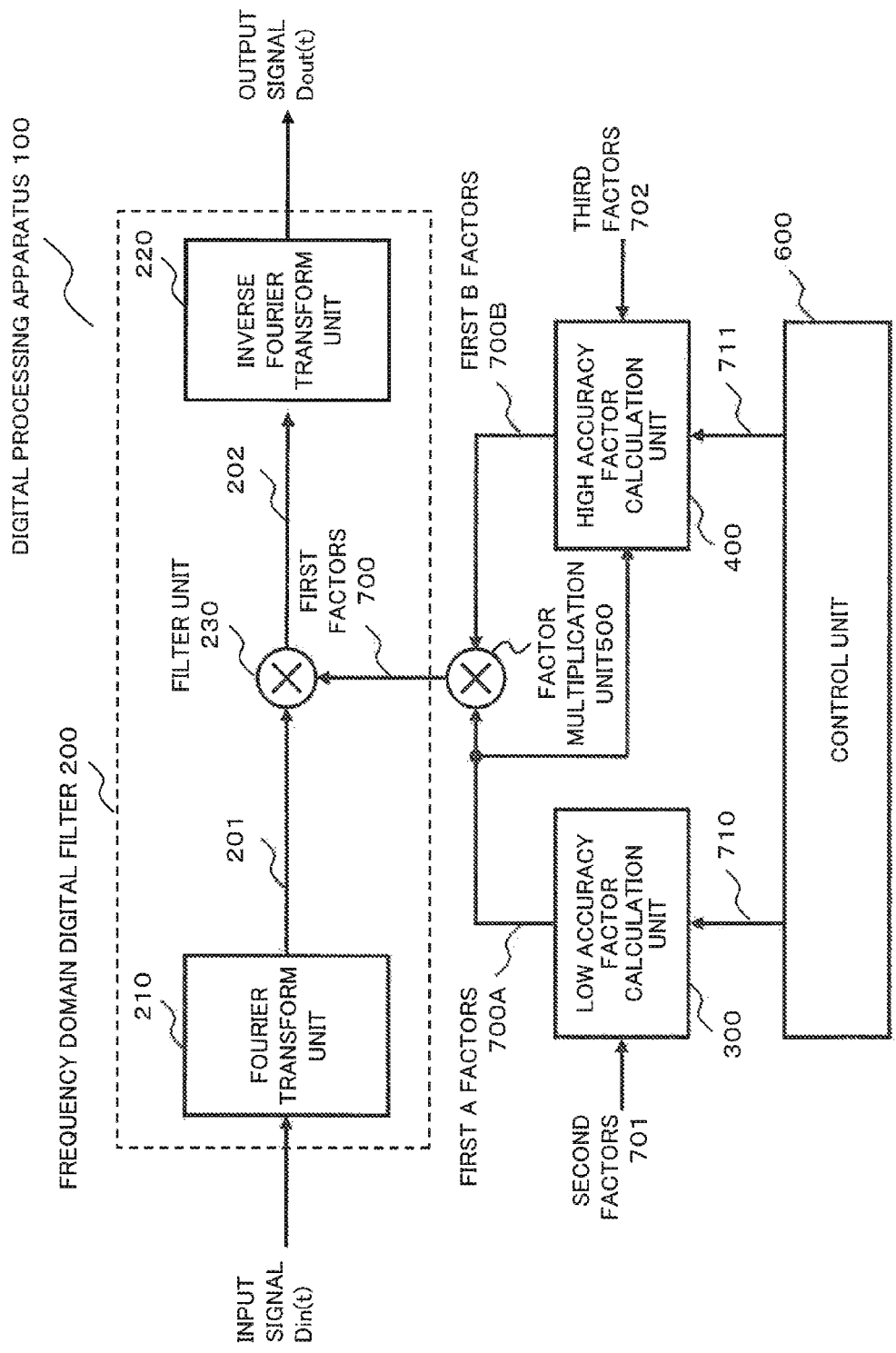
FIG. 1 is a block diagram illustrating a configuration of a digital processing apparatus according to a first exemplary embodiment.

Hereinafter, exemplary embodiments of the present invention will be described using drawings. Note that, throughout all drawings, the same or similar reference numerals are assigned to the same or similar components and the redundant description will be omitted.

(First Exemplary Embodiment)

FIG. 1 is a block diagram illustrating a configuration of a digital processing apparatus 100 according to a first exemplary embodiment. The digital processing apparatus 100 includes a frequency domain digital filter 200, a low accuracy factor calculation unit 300, a high accuracy factor calculation unit 400, a factor multiplication unit 500, and a control unit 600.

The frequency domain digital filter 200 has the same or similar configuration to the FDE circuit 990. In other words, the frequency domain digital filter 200 includes a Fourier transform unit 210, an inverse Fourier transform unit 220, and a filter unit 230. The Fourier transform unit 210 Fourier-transforms a time domain digital signal (input signal Din(t)) to generate a frequency domain signal 201. Using N first factors 700 (N is a natural number), the filter unit 230 performs processing such as equalization on the frequency domain signal 201 in a frequency domain to generate a frequency domain signal 202. The inverse Fourier transform unit 220 performs inverse Fourier transform on the frequency domain signal 202 processed by the filter unit 230, and outputs a time domain digital signal (output signal Dout(t)). For example, when the filter unit 230 performs equalization processing on the frequency domain signal 201, waveform distortion included in the digital signal is reduced.

The factor multiplication unit 500 calculates first factors 700 by multiplying first A factors 700A input from the low accuracy factor calculation unit 300, and first B factors 700B input from the high accuracy factor calculation unit 400. The factor multiplication unit 500 sets N first factors 700 to the filter unit 230.

The control unit 600 initializes values of all the factors including the first A factors 700A and the first B factors 700B into 1, and after that, causes the low accuracy factor calculation unit 300 to operate first, and then causes the high accuracy factor calculation unit 400 to operate. Hereinafter, the procedure will be described.

The low accuracy factor calculation unit 300 calculates the first A factors 700A using m second factors 701 (m is a natural number satisfying N>m), and inputs the calculated result into the factor multiplication unit 500. When the high accuracy factor calculation unit 400 does not operate, initial values of the first B factors 700B are 1. Therefore, the factor multiplication unit 500 outputs the input first A factors 700A as the first factors 700. As a result, the first A factors 700A are set in the filter unit 230.

For example, when N=4096, m may be m<10. Therefore, when the first factors 700 are calculated only using the m second factors 701, calculation processing required for the calculation of factors to be used for setting of the characteristics of the filter unit 230 decreases comparing with the case in which the first factors are calculated using N factors. In other words, the low accuracy factor calculation unit 300 can set filter factors in a short time.

Subsequently, the control unit 600 causes the high accuracy factor calculation unit 400 to start an operation. The high accuracy factor calculation unit 400 calculates the first B factors 700B on the basis of ratios of N third factors 702 and the first A factors 700A, and inputs the calculation result into the factor multiplication unit 500. During the operation of the high accuracy factor calculation unit 400, the low accuracy factor calculation unit 300 holds the first A factors 700A output at the time of operation start of the high accuracy factor calculation unit 400, and outputs the factors to the factor multiplication unit 500.

Values closer to target filter characteristics compared to the first A factors 700A calculated from the second factors 701 are calculated by computation and set as the third factors 702. Alternatively, values of factors for achieving the target filter characteristics are calculated by computation and set as the third factors 702.

It may take relatively long time for calculating such third factors 702 and inputting the factors into the high accuracy factor calculation unit 400. It is however only necessary to complete the calculation of the third factors 702 until starting the operation of the high accuracy factor calculation unit 400 since the high accuracy factor calculation unit 400 starts the operation later than the low accuracy factor calculation unit 300. In other words, the control unit 600 causes the high accuracy factor calculation unit 400 to start the operation after the third factors 702 are input into the high accuracy factor calculation unit 400. Since the first A factors 700A calculated by the low accuracy factor calculation unit 300 are held and set to the first factors 700 as mentioned above, there is no problem in communications as long as a filter has largely desired filter characteristics even though the accuracy of the filter is slightly lowered. Therefore, it may require a certain amount of time for calculation of the third factors 702.

The factor multiplication unit 500 multiplies the first A factors 700A and the first B factors 700B to calculate the N first factors 700 to be used by the filter unit 230. The factor multiplication unit 500 then sets the calculated first factors 700 in the filter unit 230. In this calculation, the first B factors 700B are set on the basis of ratios of the third factors 702 and the first A factors 700A. Specifically, the first B factors 700B changes in a stepwise fashion to the values of the ratios of the third factors 702 and the first A factors 700A, which serve as target values from an initial value which is 1, as described later. Therefore, by multiplying the first A factors 700A and the first B factors 700B, the first factors 700 are set with higher accuracy compared to the case of setting the first factors 700 only using the first A factors 700A. Note that the "high accuracy" or "higher accuracy" means that the first factors 700 are set to values closer to the target filter characteristics compared to the case of setting the factors only using the low accuracy factor calculation unit 300.

In this way, in the digital processing apparatus 100 according to the first exemplary embodiment, the m second factors 701 (where N>m) generated by the low accuracy factor calculation unit 300 enables the N first factors 700 used by the filter unit 230 to be set for a short time compared to the case of calculating and setting all the N factor target values.

By the high accuracy factor calculation unit 400, the ratios of the third factors 702 and the first A factors 700A are calculated with high accuracy due to the setting of the target values of the first factors 700 to the third factors 702, and the first B factors 700B are calculated on the basis of the ratios.

Furthermore, the high accuracy factor calculation unit 400 outputs the first B factors 700B after starting the operation of the low accuracy factor calculation unit 300. The first B factors 700B are values changing from the initial value, 1, to ratios of the third factors 702 and the first A factors 700A. Changing the first B factors 700B gradually or in a stepwise fashion enables an improvement of the accuracy of the first factors 700 used by the filter unit 230 while suppressing the occurrence of a discontinuous change of the signal quality in the output signal Dout(t), a bit error, and the like due to a rapid change of the filter factors. Therefore, the digital processing apparatus 100 can set the first factors 700 in a short time using the low accuracy factor calculation unit 300, and can eventually improve the accuracy of the processing in the filter unit 230 by using the high accuracy factor calculation unit 400. Hereinafter, operations of respective units of the digital processing apparatus 100 will be described in more detail.

First, the frequency domain digital filter 200 will be described. A digital signal (input signal) Din(t) which is input into the frequency domain digital filter 200 is a signal digitized by an analog-to-digital converter or the like from an analog signal received by a receiving apparatus, for example in optical communications or wireless communications. A Fourier transform unit 210 is a Fourier transform circuit of which the number of points is N, for example. Fourier transform processing performed by the Fourier transform unit 210 is DFT (discrete Fourier transform) or FFT (fast Fourier transform). When the Fourier transform unit 210 performs DFT, the inverse Fourier transform unit 220 performs IDFT (Inverse discrete Fourier transform). On the other hand, when the Fourier transform unit 210 performs FFT, the inverse Fourier transform unit 220 performs IFFT (Inverse fast Fourier transform) processing.

Figure 2:
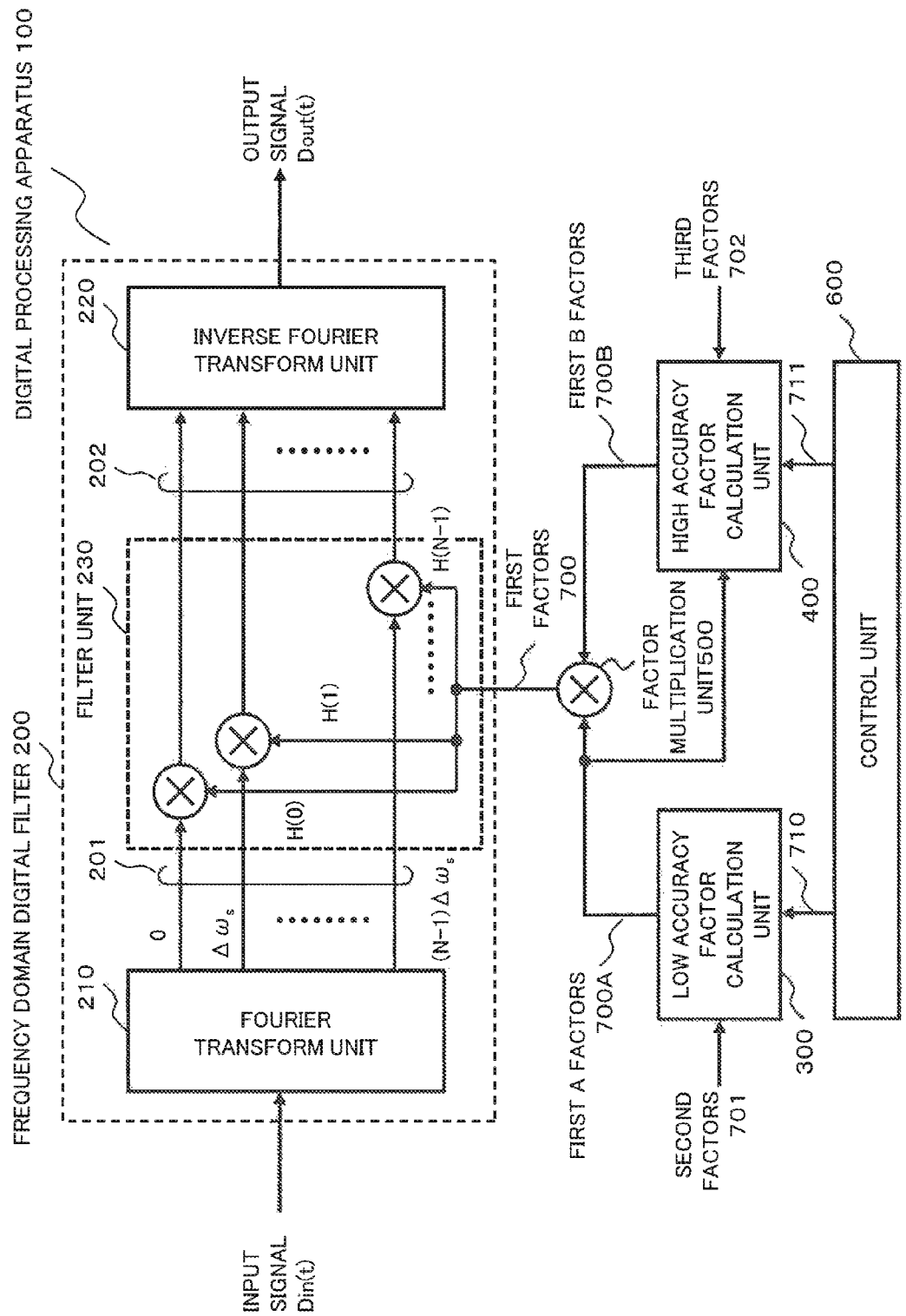
FIG. 2 is a diagram for describing the digital processing apparatus in detail.

FIG. 2 is a diagram for describing the digital processing apparatus 100 in detail. The Fourier transform unit 210 is a Fourier transform circuit for size N, and transforms the input signal Din(t) which is a digital signal in a time domain into N digital signals in a frequency domain. The frequency interval of the digital signals after transformation is a constant frequency $\Delta\omega_s$. Note that $\Delta\omega_s=2\pi f_s/N$ is established where $f_s$ denotes a sampling frequency. The filter unit 230 multiplies N digital signals in a frequency domain by the first factors H(x) (x is an integer of 0≤x≤N−1), respectively. Each of the first factors 700 are set for associated one of the N frequency domain signals 201. In other words, the first factors 700 are factors set for respective frequencies. The N frequency domain signals 202 after multiplication by the first factors 700 are transformed into a digital signal Dout(t) in a time domain by the inverse Fourier transform unit 220.

Next, a setting means of the first factors 700 will be described. The first factors 700 are filter factors of the frequency domain digital filter 200. Specifically, the first factors 700 are set in the filter unit 230. As illustrated in FIG. 2, the first factors 700 are the multiplication result of the first A factors 700A and the first B factors 700B in the factor multiplication unit 500. In other words, the characteristics obtained by the multiplication of the respective filter factors (the first A factors 700A and the first B factors 700B) calculated by the low accuracy factor calculation unit 300 and the high accuracy factor calculation unit 400 are represented in the first factors 700. With the first factors 700, the filter unit 230 performs equalization processing for reducing waveform distortion in the frequency domain signal 201.

In an initial state, for example, at the time of activating a communication device, the control unit 600 first causes the low accuracy factor calculation unit 300 to operate by a first control signal 710, and causes the high accuracy factor calculation unit 400 to stop by a second control signal 711. In addition, the control unit 600 initializes all the values of the factors including the first A factors 700A and the first B factors 700B into 1.

Figure 3:
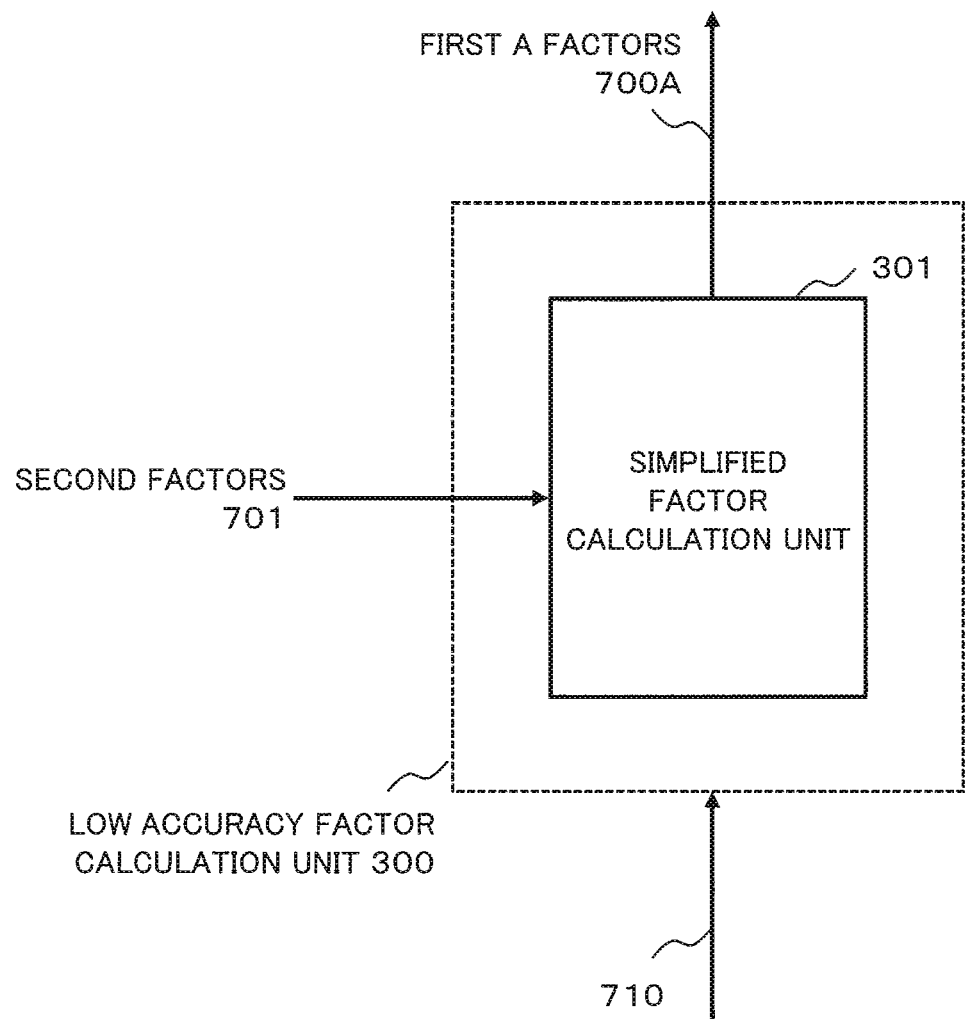
FIG. 3 is a block diagram illustrating a configuration of a low accuracy factor calculation unit.

FIG. 3 is a block diagram illustrating a configuration of the low accuracy factor calculation unit 300. The low accuracy factor calculation unit 300 includes a simplified factor calculation unit 301. The simplified factor calculation unit 301 calculates the N first A factors 700A where N is the same number as the number of the first factors 700, on the basis of the m second factors 701 (where N>m). In other words, the simplified factor calculation unit 301 does not calculate the respective N first factors 700, but calculates the N first A factors 700A from the m second factors 701, m being smaller than N, for example, by interpolating a value between the two second factors 701 adjacent to each other. As a result, the calculation amount and circuit size for factor calculation processing in the simplified factor calculation unit 301 are reduced. At this time, the second factors 701 may be factors set for respective frequencies as in the first factors, but it is not limited to this manner. The concrete operational example of the low accuracy factor calculation unit 300 will be described later.

The first A factors 700A calculated by the low accuracy factor calculation unit 300 are multiplied by the first B factors 700B in the factor multiplication unit 500. The output of the factor multiplication unit 500 is set as the first factors 700, and is used for the processing in the frequency domain digital filter 200. Note that, at this time, the high accuracy factor calculation unit 400 is in an invalid state, and all the values of the first B factors 700B are 1. Therefore, the first factors 700 are equal to the first A factors 700A.

Next, the control unit 600 keeps the low accuracy factor calculation unit 300 in operation with the first control signal 710, and causes the high accuracy factor calculation unit 400 to operate with the second control signal 711. The low accuracy factor calculation unit 300 maintains the values of the first A factors 700A output at the time when the high accuracy factor calculation unit 400 starts the operation even after the operation start of the high accuracy factor calculation unit 400.

Figure 4:
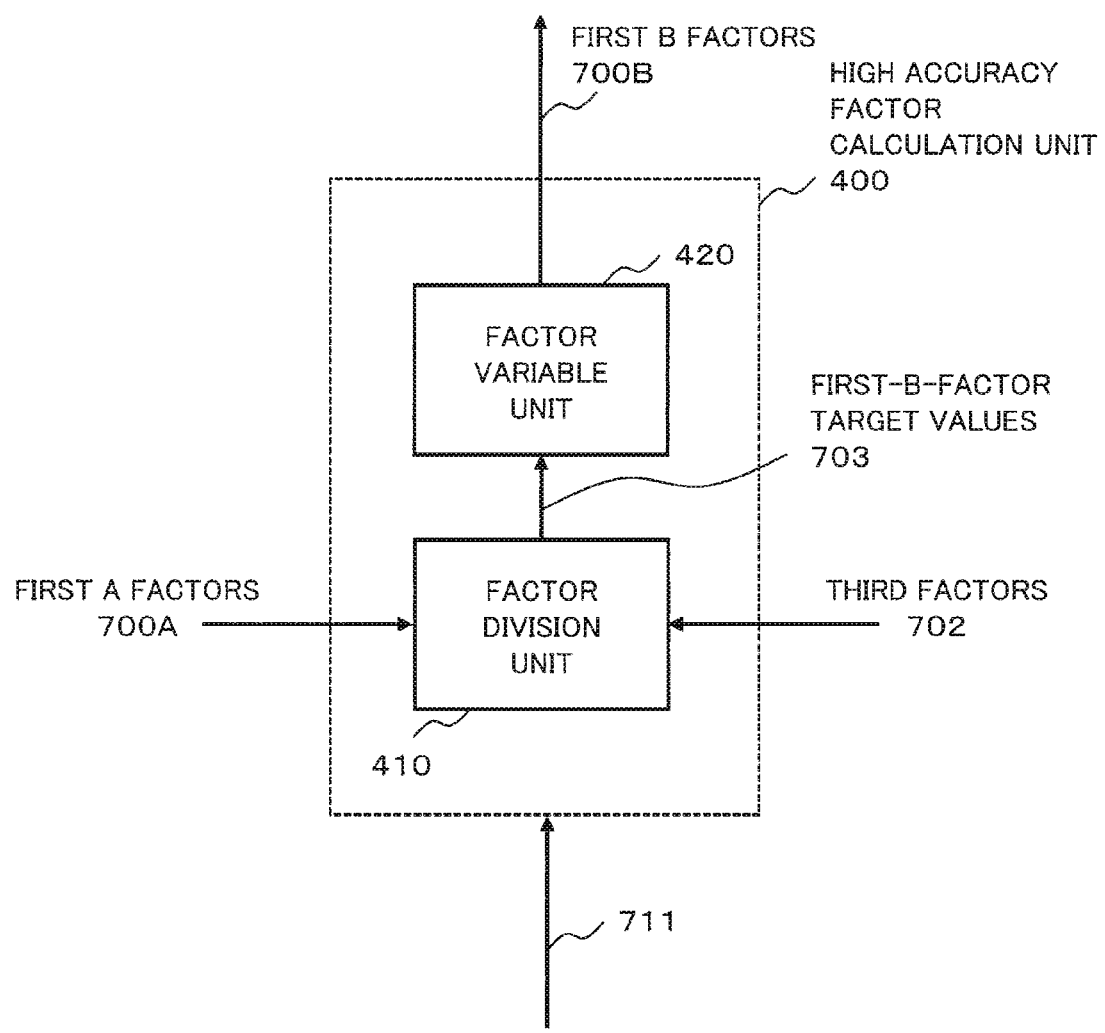
FIG. 4 is a block diagram illustrating a configuration of a high accuracy factor calculation unit.

FIG. 4 is a block diagram illustrating a configuration of the high accuracy factor calculation unit 400. The high accuracy factor calculation unit 400 includes a factor division unit 410 and a factor variable unit 420. The factor division unit 410 calculates ratios of the third factors 702 and the first A factors 700A, and sets the ratios as the first-B-factor target values 703. The factor variable unit 420 changes the first B factors 700B on the basis of the first-B-factor target values 703. Specifically, when the high accuracy factor calculation unit 400 starts an operation, the factor variable unit 420 changes the first B factors 700B from an initial value, 1, to the first-B-factor target values 703 gradually or in a stepwise fashion.

Figure 5:
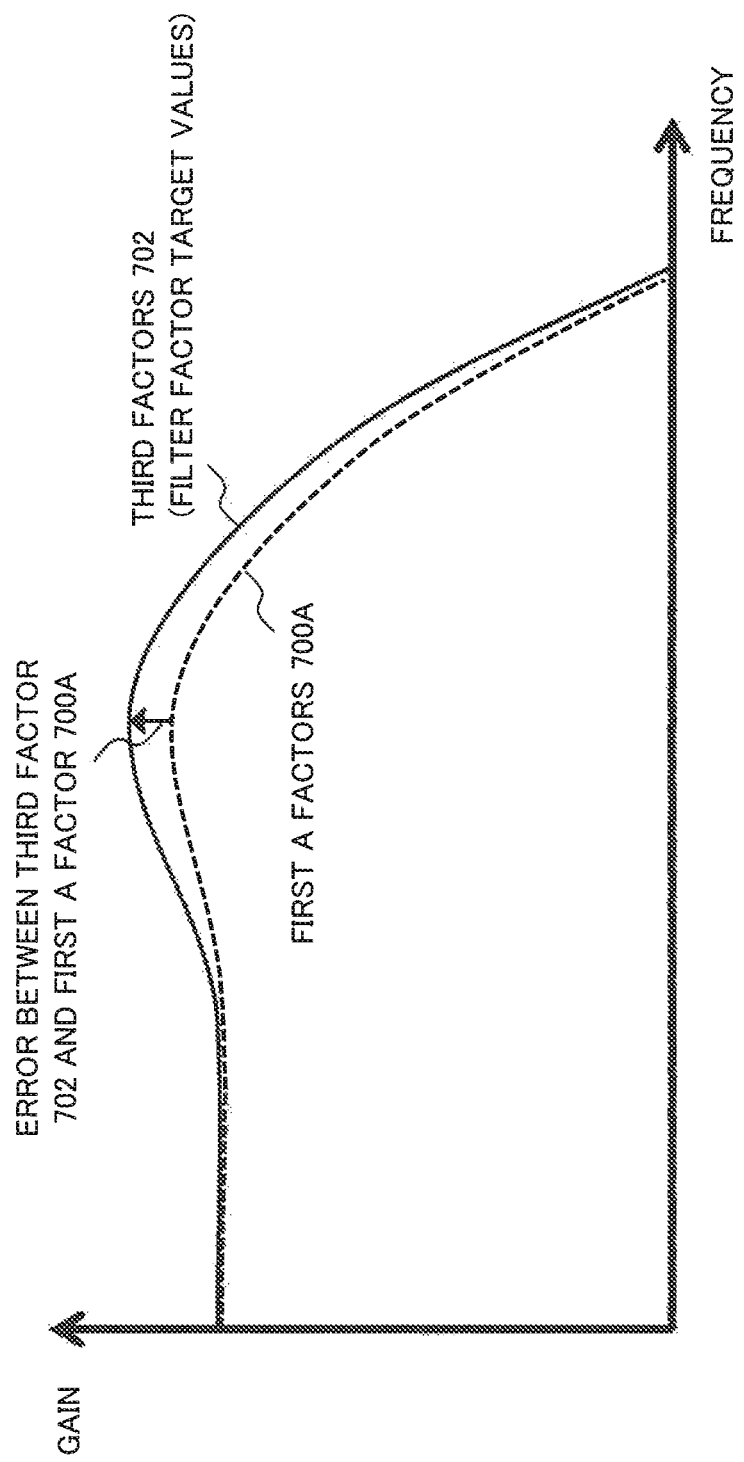
FIG. 5 is a diagram illustrating an example of a relationship between a first A factor and a third factor.
Figure 6:
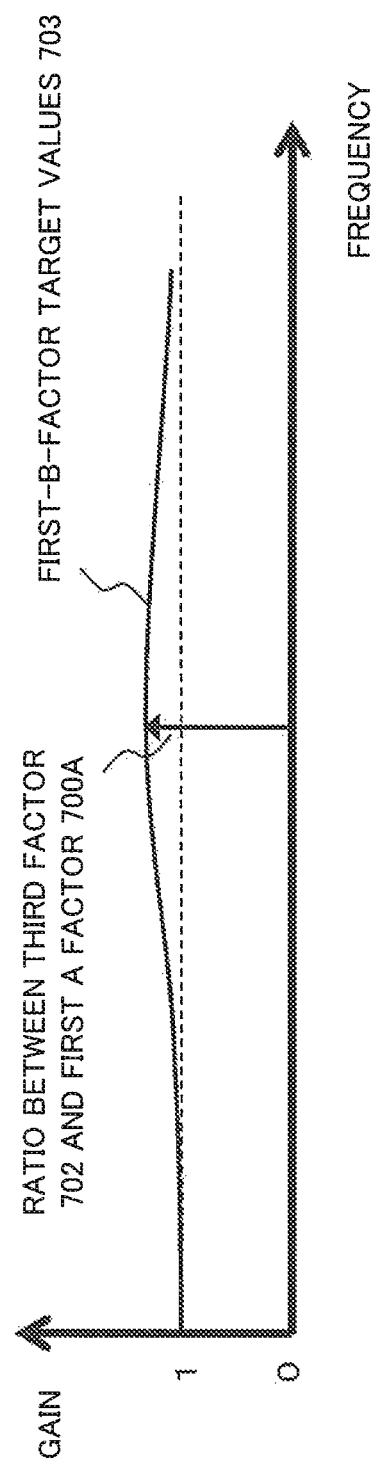
FIG. 6 is a diagram illustrating an example of a target value of a first B factor.

FIG. 5 and FIG. 6 are diagrams describing the operation of the high accuracy factor calculation unit 400. FIG. 5 is a diagram illustrating an example of a relationship between the first A factors 700A and the third factors 702 which are filter factor target values. As mentioned previously, the factor calculation processing in the low accuracy factor calculation unit 300 is simplified. Therefore, the characteristics of the filter unit 230 set only by the first A factors 700A include an error to some extent against the characteristics to be targeted, in other words, the third factors 702, as illustrated in FIG. 5 as an example. FIG. 6 is a diagram illustrating an example of the first-B-factor target values 703 for compensating the error between the first A factors 700A and the third factors 702 which are the filter factor target values. The first-B-factor target values 703 are ratios of the third factors 702 and the first A factors 700A.

Figure 7:
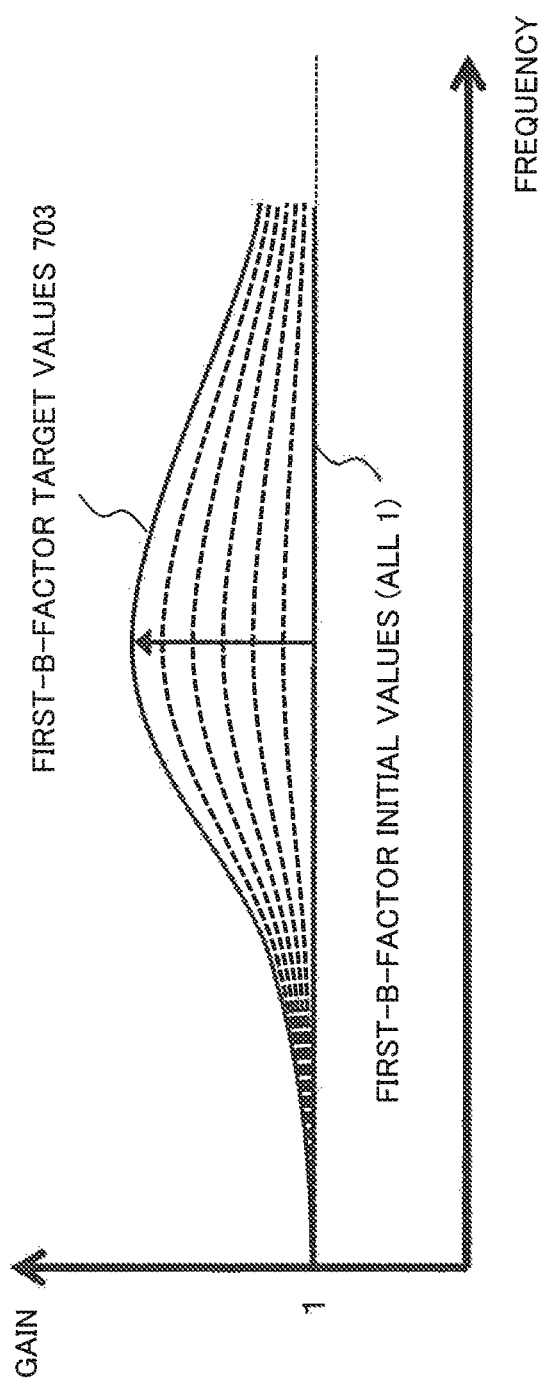
FIG. 7 is a diagram for describing an operation of a factor variable unit.

FIG. 7 is a diagram for describing an operation of the factor variable unit 420. The initial values of the N first B factors 700B are all 1. The factor variable unit 420 changes the first B factors 700B so as to gradually approach the first-B-factor target values 703 from the initial value, 1. In an example of FIG. 7, the first B factors 700B are changed in six steps to the first-B-factor target values which are final target values. Note that the number of the steps for the change of the first B factors 700B is not limited to six. For example, the steps for the change may be increased, such as 10 steps, 100 steps. Increasing the number of steps for the change of the first B factors 700B enables a compensation of an error between the first A factors 700A and the third factors 702, while changing the first B factors 700B from the initial value, 1, to the first-B-factor target values 703 more smoothly.

The first B factors 700B calculated by the high accuracy factor calculation unit 400 are multiplied by the first A factors 700A in the factor multiplication unit 500. Then, the multiplication result is set as the first factors 700. The first B factors 700B changes from 1 to the first-B-factor target values 703. Therefore, multiplying the first A factors 700A and the first B factor 700B causes the first factors 700 to gradually approach the third factors 702 set as the filter factor target values.

Gradually changing the first B factors 700B in this way makes it possible to suppress the occurrence of a discontinuous change of the signal quality in the output signal Dout(t), a bit error, or the like due to a rapid change of the filter characteristics of the filter unit 230.

As described above, the filter factors to be targeted (filter factor target values) in frequency domain digital filter processing may be set as the third factors 702. The filter factor target values may be filter characteristics by which a signal Q value indicating quality of a communication signal generally used becomes the maximum. Alternatively, these values may be filter characteristics by which a bit error rate of the output signal Dout(t) becomes the minimum. Further, the result calculated as a highly accurate target value on the basis of a certain monitor signal may be set to the filter factor target values. Furthermore, factors calculated by various means, such as theoretical calculated values, may be set as the third factors 702.

Figure 8:
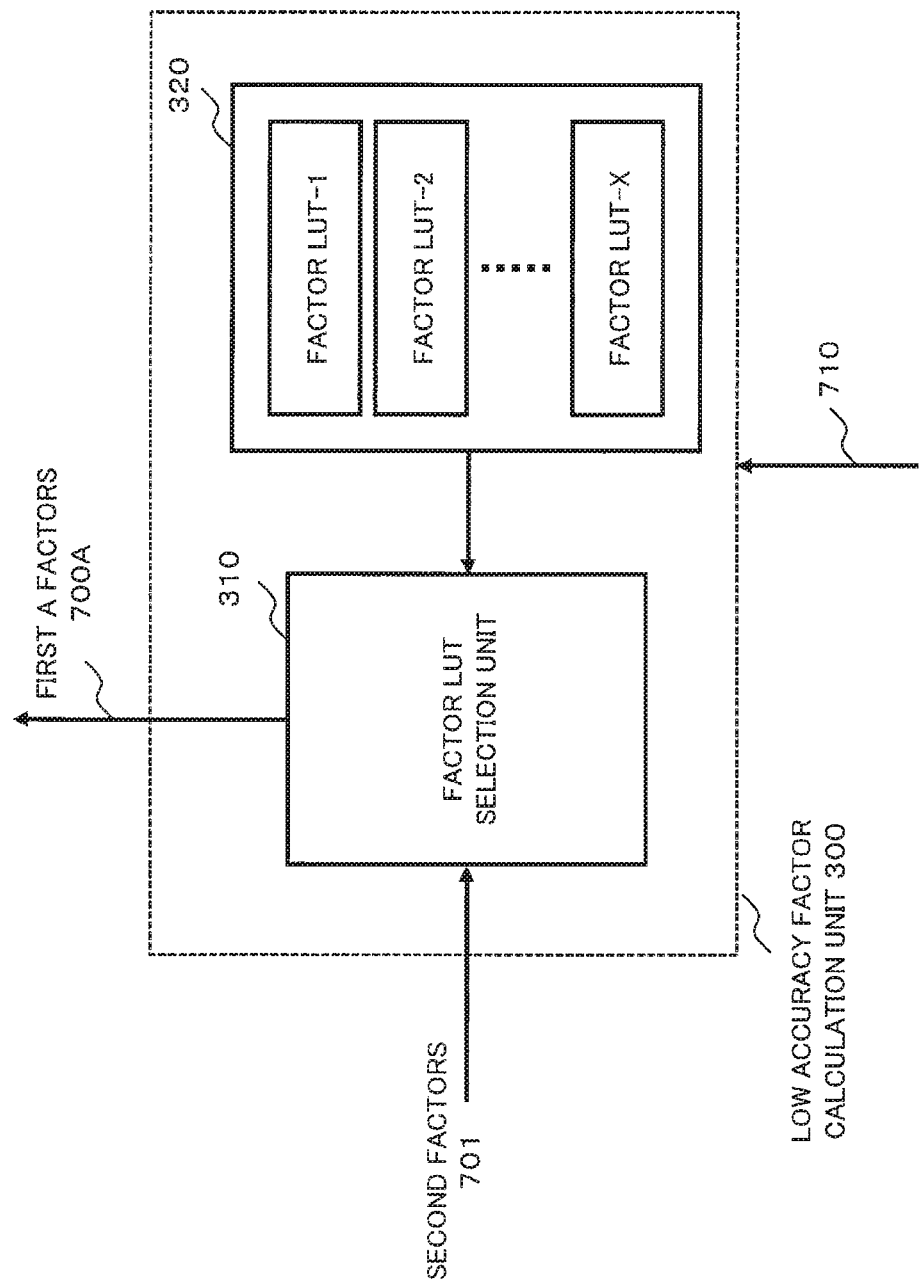
FIG. 8 is a diagram for describing a first example of processing performed by the low accuracy factor calculation unit.

FIG. 8 is a diagram for describing a first example of processing performed by the low accuracy factor calculation unit 300. In the first example, the low accuracy factor calculation unit 300 includes a factor look-up table (LUT) selection unit 310 and a factor-LUT group 320 prepared in advance, as illustrated in FIG. 8. The factor-LUT group 320 includes a plurality of LUTs, i.e, x factor-LUTs, factor-LUT-1 to factor-LUT-X (X is a natural number).

Figure 9:
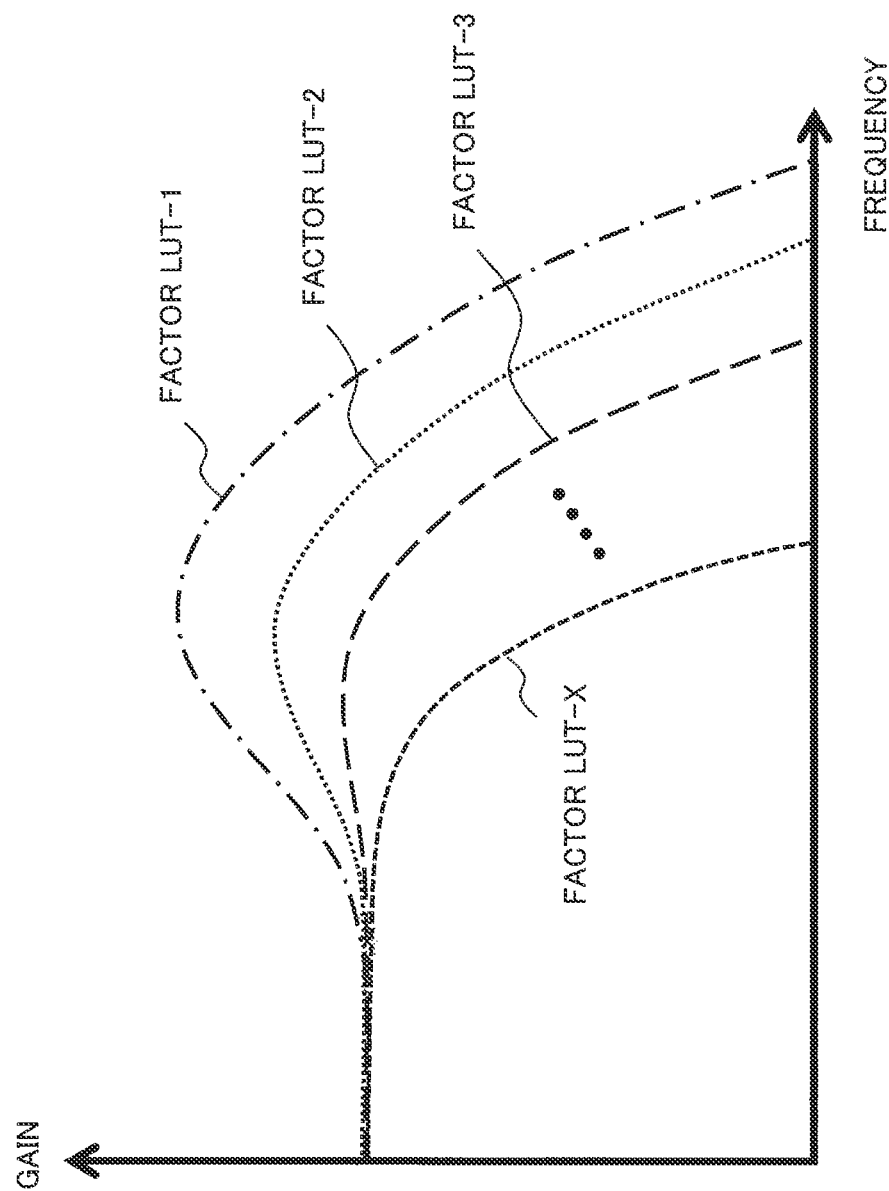
FIG. 9 is a diagram illustrating an example of filter characteristics corresponding to factor LUTs.

FIG. 9 is a diagram illustrating an example of filter characteristics corresponding to the factor LUTs. The vertical axis of FIG. 9 illustrates a gain of the filter, and the horizontal axis illustrates a frequency thereof. The low accuracy factor calculation unit 300 selects, on the basis of the second factors 701, a factor LUT nearest to the second factors 701 from the factor-LUT-1 to the factor-LUT-X prepared in advance, and sets the selected factor LUT as the first A factors 700A.

Here, the low accuracy factor calculation unit 300 may set filter characteristics to be targeted as the second factors 701. Using the factor-LUT group 320 including various filter characteristics calculated in advance enables the low accuracy factor calculation unit 300 to set the first A factors 700A only by executing the algorithm for selecting an LUT in the factor LUT selection unit 310. As a result, the factor calculation processing in the low accuracy factor calculation unit 300 is simplified significantly.

Figure 10:
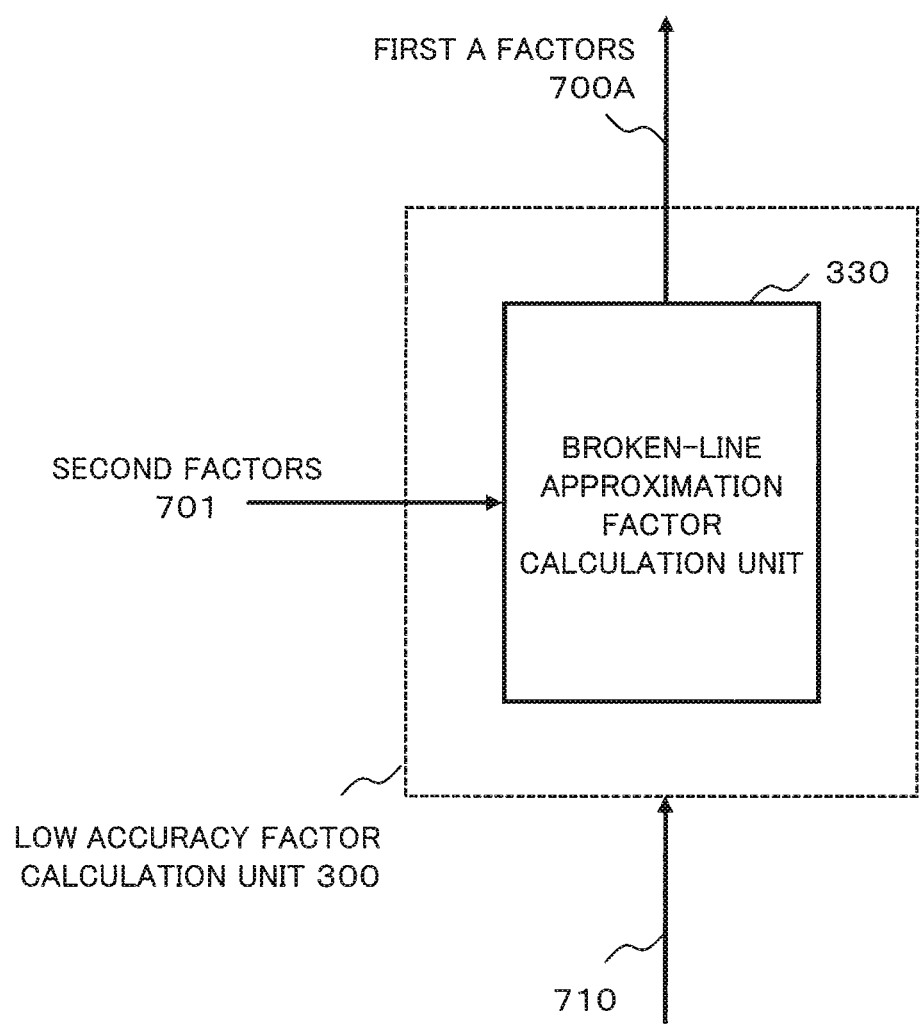
FIG. 10 is a diagram for describing a second example of processing performed by the low accuracy factor calculation unit.

FIG. 10 is a diagram for describing a second example of processing performed by the low accuracy factor calculation unit 300. In the second example, the low accuracy factor calculation unit 300 includes a broken-line-approximation factor calculation unit 330. The broken-line-approximation factor calculation unit 330 performs an interpolation according to a broken line approximation on the m second factors 701 (where N>m) to calculate the N first A factors 700A.

Figure 11:
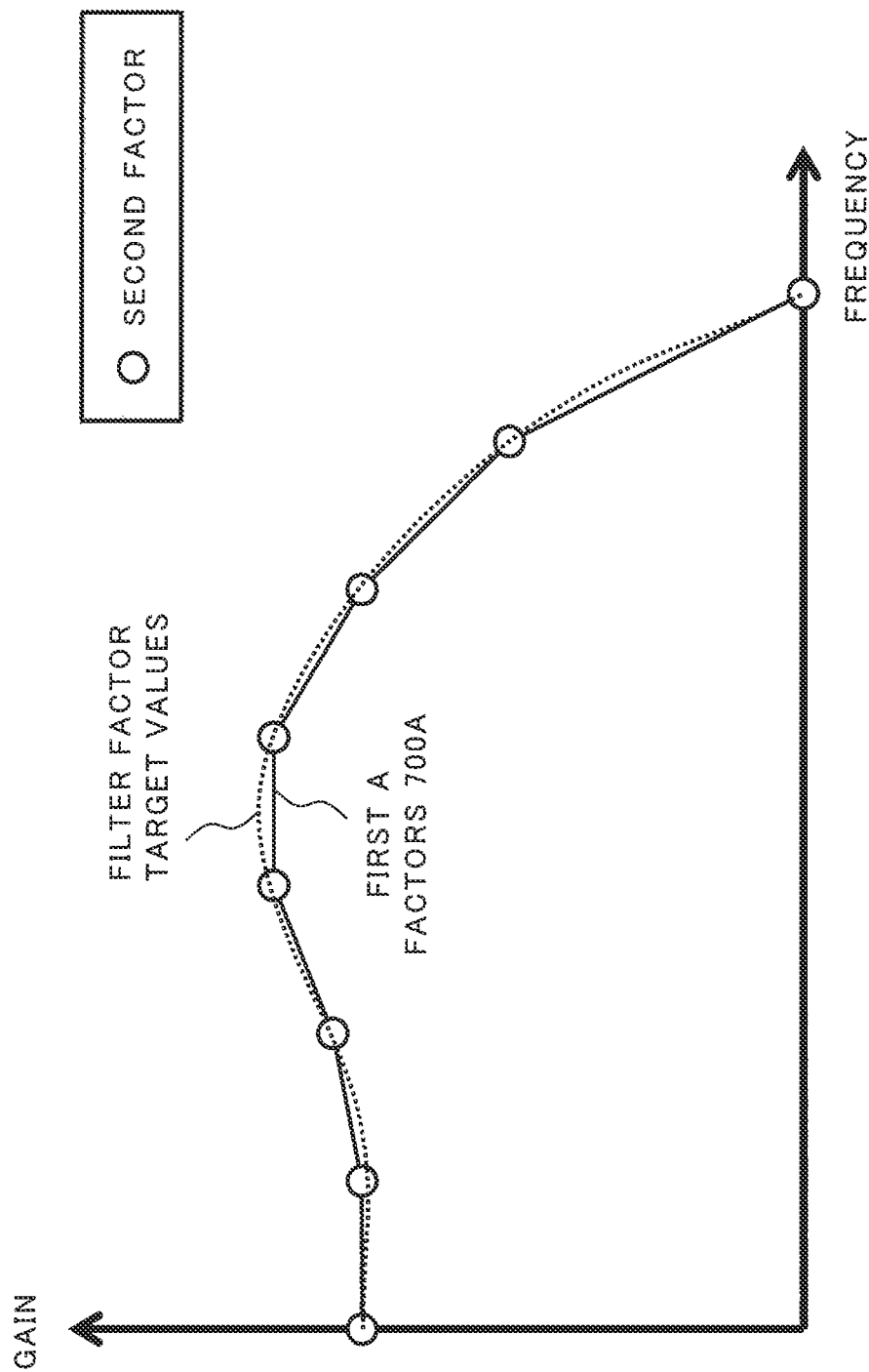
FIG. 11 is a diagram illustrating an example of factors in the second example of the low accuracy factor calculation unit.

FIG. 11 is a diagram illustrating an example of factors in the second example of the low accuracy factor calculation unit 300. The low accuracy factor calculation unit 300 in the second example interpolates, with a straight line, a value between values of the m second factors 701 classified into some segments of frequency domains from the filter factors to be targeted to calculate the N first A factors 700A. Note that in the second example, since a broken line approximation is applied, the factor calculation processing can be simplified while an error to some extent occurs between the calculated filter factors and the filter factors to be targeted.

Note that, in FIG. 11, all frequency intervals of m segments may be equal intervals, or a segment with an interval different from the other intervals may be included.

The calculation of factors in the low accuracy factor calculation unit 300 and the high accuracy factor calculation unit 400 mentioned above may be performed by hardware (LSI (Large Scale Integration) such as FPGA (field programmable gate array)), or by a CPU (Central Processing Unit, microcomputer) controlled by software. Factors may be calculated using a PC (Personal Computer) or the like. As for these calculations, a part of processing may be performed using software, and remaining processing may be performed by hardware.

As above, the digital processing apparatus 100 in the first exemplary embodiment can set the N first factors 700 in the low accuracy factor calculation unit 300 using the m second factors 701. Therefore, it is possible to reduce calculation processing required for factor setting of a filter and to achieve high-speed filter factor setting. The high accuracy factor calculation unit 400 compares the third factors 702 which are filter factor target values calculated with high accuracy with the first A factors 700A calculated by the low accuracy factor calculation unit 300. On the basis of the result of this comparison, the high accuracy factor calculation unit 400 calculates, with high accuracy, the first B factors 700B to be used as the filter factors for correcting a difference between both the factors, and corrects the first factors 700. Therefore, the digital processing apparatus 100 can eventually improve the accuracy of filter characteristics. In other words, the digital processing apparatus 100 can also achieve high filter accuracy while setting at high speed the characteristics of the frequency domain digital filter 200 at high speed.

Furthermore, the digital processing apparatus 100 can suppress the occurrence of a discontinuous change of the signal quality in the output signal Dout(t), a bit error, or the like due to a rapid change of filter factors, by changing the first B factors 700B output from the high accuracy factor calculation unit 400 gradually or in a stepwise fashion.

(Second Exemplary Embodiment)

Figure 12:
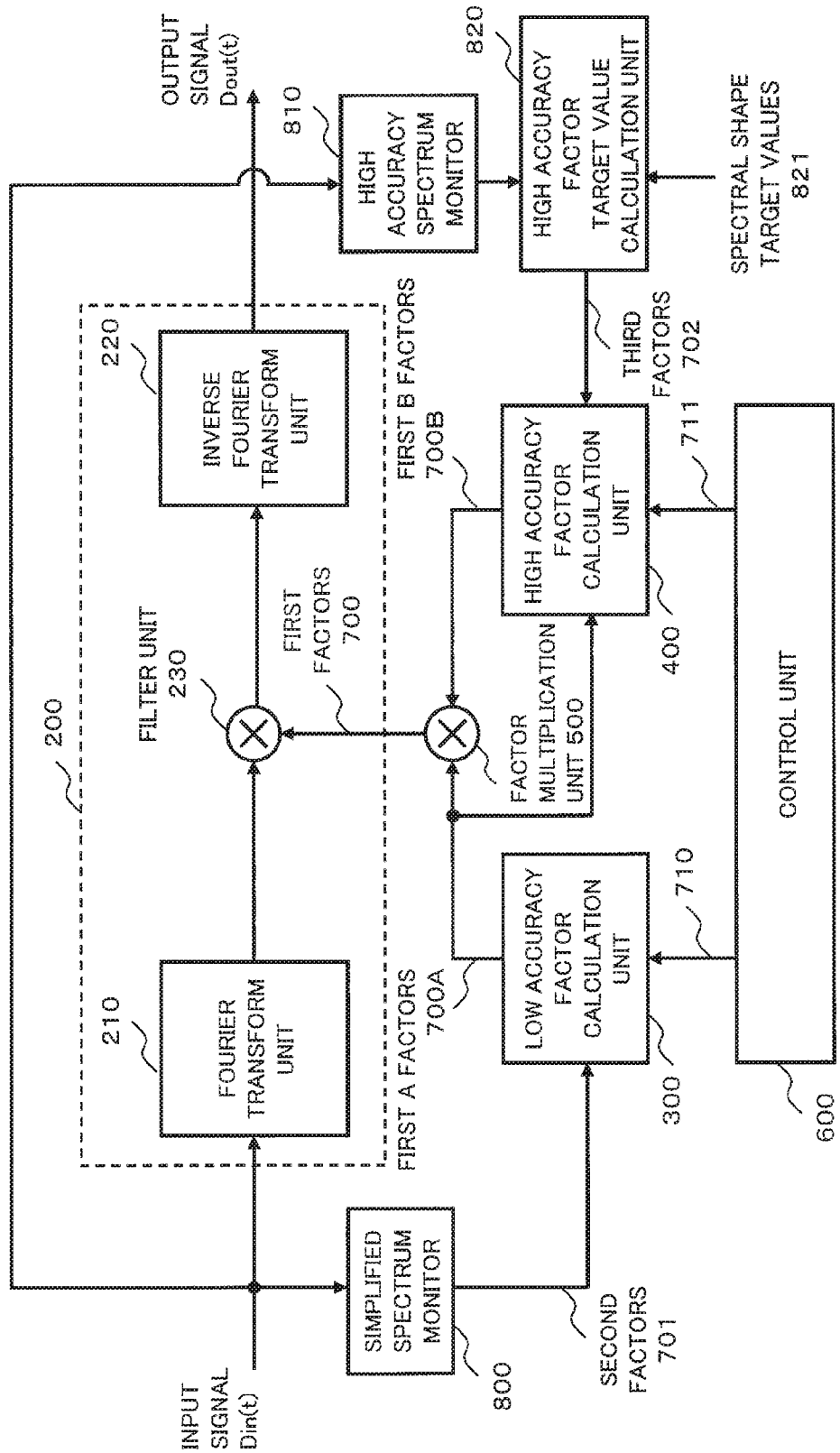
FIG. 12 is a diagram illustrating a configuration of a digital processing apparatus according to a second exemplary embodiment.

FIG. 12 is a diagram illustrating a configuration of a digital processing apparatus 100A according to a second exemplary embodiment. The digital processing apparatus 100A includes, in addition to the configurations in the first exemplary embodiment, a simplified spectrum monitor 800, a high accuracy spectrum monitor 810, and a high accuracy factor target value calculation unit 820. The other configurations of the digital processing apparatus 100A are the same as or similar to those of the digital processing apparatus 100 according to the first exemplary embodiment.

The simplified spectrum monitor 800 monitors spectral intensities of arbitrary frequency components at some frequencies from an input signal Din(t). In this example, a spectral intensity Pdc in DC (direct current) component and a power spectral intensity P1 in a certain frequency fmon are monitored. For example, combining a BPF (band pass filter) which passes only a certain frequency band and a power detector circuit makes it possible to easily monitor a spectral intensity in a specific frequency as power. The simplified spectrum monitor 800 outputs the two obtained parameters (Pdc and P1) to the low accuracy factor calculation unit 300 as the second factors 701.

The high accuracy spectrum monitor 810 also monitors spectral intensities with high accuracy over a wide frequency domain from the input signal Din(t), and outputs the obtained spectral intensities to the high accuracy factor target value calculation unit 820. The range of frequency for monitoring the spectral intensities may include, for example, frequencies from DC to $(N-1)\Delta\omega_s$. The high accuracy spectrum monitor 810 may be configured in which a function changing a pass band of the BPF is added to the configuration of the simplified spectrum monitor 800. Alternatively, the high accuracy spectrum monitor 810 may down-convert a signal obtained by mixing of an output of a reference oscillator capable of sweeping a frequency, like a known spectrum analyzer, with the input signal Din(t), and may measure the power of the down-converted signal. In order to monitor a more stable spectral intensity, the above-mentioned monitor operation may be performed multiple times, and the average may be calculated. In this way, the spectral intensities of the high accuracy input signal Din(t) can be monitored by using a general technique although processing for the monitored signal requires time.

The high accuracy factor target value calculation unit 820 calculates, on the basis of the obtained high accuracy spectrum, ratios of the spectrum to spectral shape target values 821 set in advance, obtains target values of filter factors with high accuracy, and outputs the values to the high accuracy factor calculation unit 400 as the third factors 702.

A concrete procedure of factor setting for the first factors 700 will be described using FIG. 13 and FIG. 14.

Figure 13:
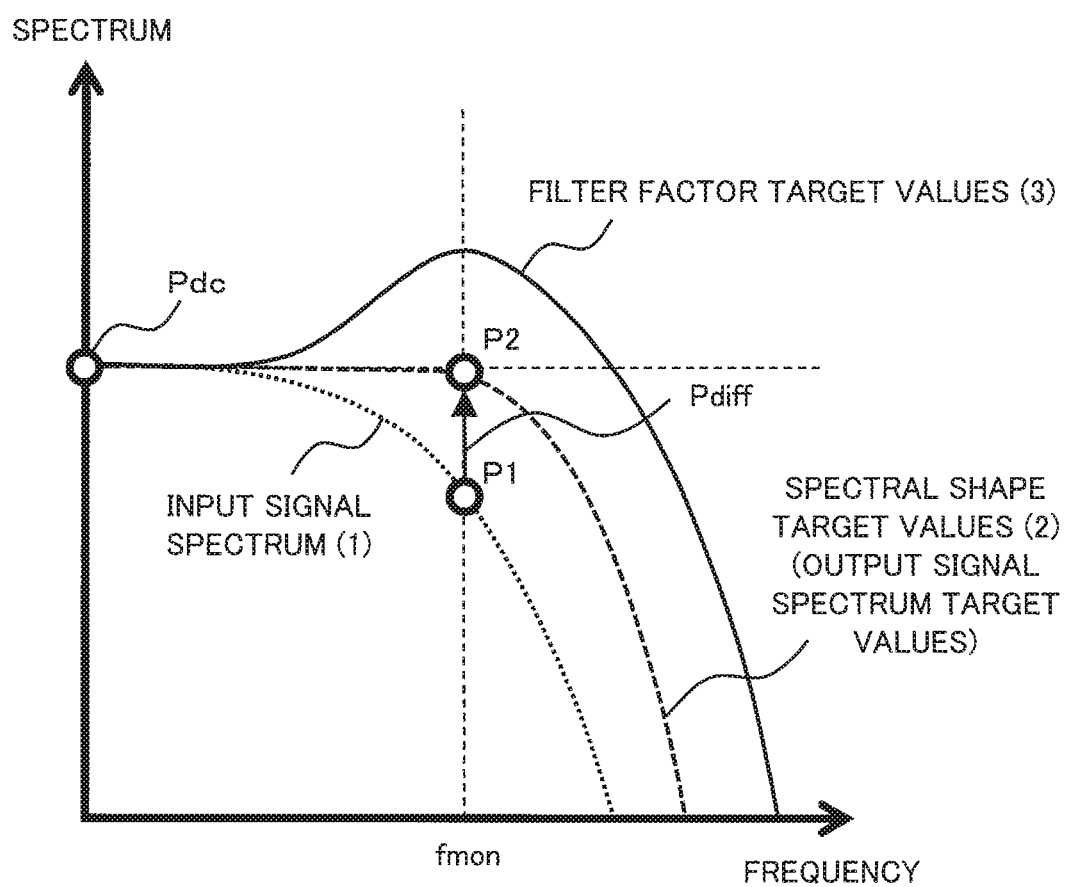
FIG. 13 is a diagram illustrating an example of factor target values of the digital processing apparatus according to the second exemplary embodiment.

FIG. 13 is a diagram illustrating an example of factor target values of the digital processing apparatus according to the second exemplary embodiment. FIG. 13 illustrates an input signal spectrum (1) before filter processing, spectral shape target values (2), and filter factor target values (3). Here, the input signal spectrum (1) is a spectrum of the input signal before filter processing. The spectral shape target values (2) are targeted values of a spectrum of the output signal Dout(t). The filter factor target values (3) illustrate filter factors required for compensating the input signal spectrum (1) so as to be the spectral shape target values (2). The spectral shape target values (2) can be obtained, for example, from an assumption of a theoretically calculated spectral shape or the like in a situation with no influence on frequency characteristics due to linear distortion occurring in a communication system. Alternatively, the spectral shape target values (2) may be values experientially calculated from experiments or the like. FIG. 13 illustrates an example of a situation in which frequency characteristics are degraded due to linear distortion occurring in a certain communication system, and the band is narrowed.

First, the simplified spectrum monitor 800 measures the spectral intensity Pdc of the DC component and the spectral intensity P1 at the frequency fmon in the spectrum of the input signal Din(t) before filter processing. At this time, if the spectral intensity at a point illustrated by P1 in FIG. 13 can be lifted to P2 by the filter processing with the first A factors 700A set by using the low accuracy factor calculation unit 300, it is possible to match the spectral intensity of the output signal with a spectrum target value at least at the frequency fmon. Note that, as an example, the highest frequency among the frequency ranges where the DC component of the spectrum target value is equal to the spectral intensity is selected as fmon. In other words, the low accuracy factor calculation unit 300 which has received the spectrum with intensity of Pdc and P1 as the second factors 701 calculates filter factors (first A factors 700A) so that Pdc=P1 is established. Then, the first factors 700 are set by the factor multiplication unit 500.

A concrete procedure of factor calculation processing in the low accuracy factor calculation unit 300 will be described taking the first example of the processing performed by the low accuracy factor calculation unit 300 described with FIG. 6 in the first exemplary embodiment as an example. First, the factor LUT selection unit of the low accuracy factor calculation unit 300 calculates Pdiff=Pdc−P1 on the basis of the values of the received spectral intensities Pdc and P1 (FIG. 13). The Pdiff corresponds to an amount (gain) for lifting frequency characteristics from P1 to P2 at the frequency fmon.

Figure 14:
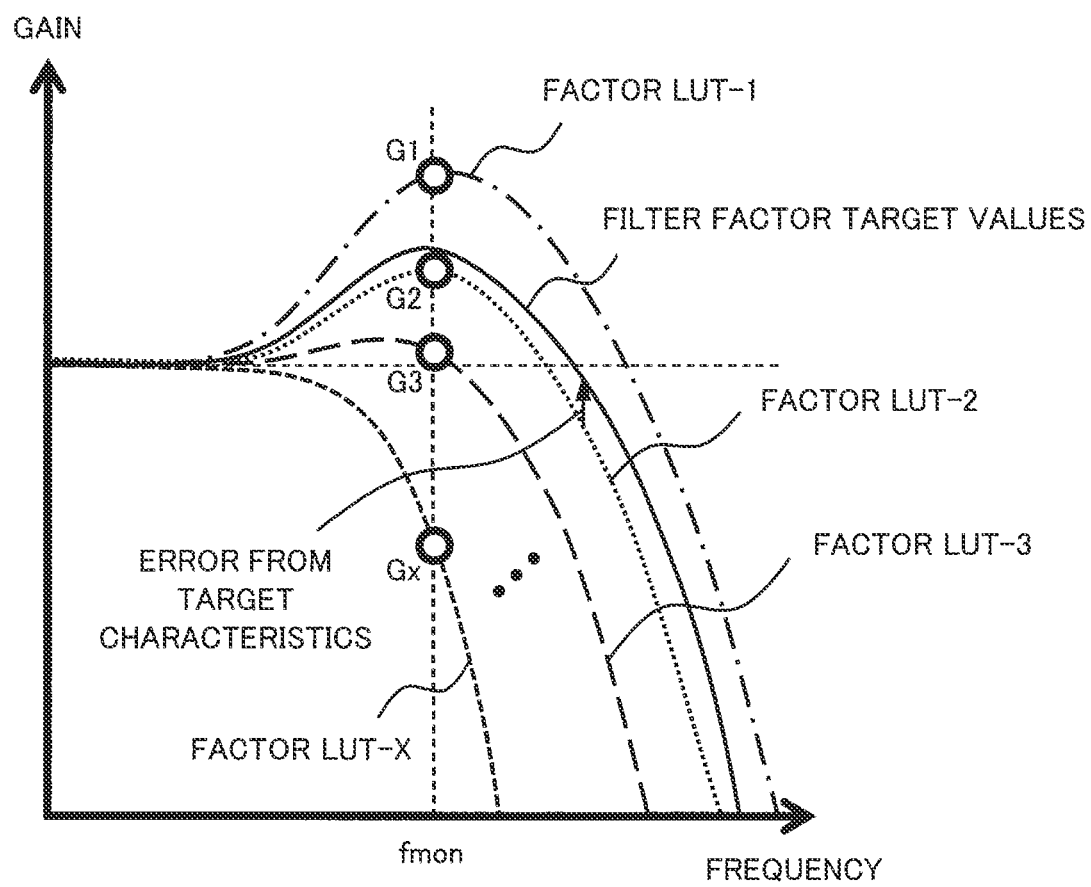
FIG. 14 is a diagram for describing a factor control method for the digital processing apparatus according to the second exemplary embodiment.

FIG. 14 is a diagram for describing a factor control method for the digital processing apparatus according to the second exemplary embodiment. The low accuracy factor calculation unit 300 selects a factor LUT with a gain nearest to Pdiff at the frequency fmon, from plural of the factor-LUT group 320 (factor-LUT-1, . . . , factor-LUT-X) with gains (G1 to Gx) held in advance. In FIG. 14, since a gain G2 of the factor-LUT-2 is the nearest to Pdiff, the factor LUT selection unit 310 selects the factor-LUT-2 as the first A factors 700A. In this way, combining a simplified spectrum monitor and a factor-LUT selection makes it possible to perform factor setting processing of the frequency domain digital filter 200 at high speed since processing for selecting the LUT is only performed, although accuracy is lower than a case using a high accuracy spectrum monitor 810 described later.

The first A factors 700A are set at high speed although accuracy is relatively low as mentioned above. Therefore, the low accuracy factor calculation unit 300 can set the value nearly close to the filter factors to be targeted to the first factors 700 in a short time. Therefore, the quality of frequency domain digital filter processing becomes a degree with no problem on communications by the low accuracy factor calculation unit 300. However, there are a few margin against a condition change or the like in this state, and communication quality degradation may be caused when conditions are changed due to a certain factor. Therefore, more highly accurate filter factor setting processing is performed using a below-mentioned high accuracy factor calculation unit 400 and the high accuracy spectrum monitor 810. Note that, as mentioned above, the quality of frequency domain digital filter processing becomes a degree with no problem on communications by the low accuracy factor calculation unit 300. Therefore, highly accurate measurement of the spectral intensity and high accuracy factor calculation processing may take long time to some extent.

The high accuracy spectrum monitor 810 monitors the spectral intensities of the input signal Din(t) before filter processing with high accuracy in a frequency range wider than the simplified spectrum monitor 800. Then, the high accuracy factor target value calculation unit 820 calculates the filter factor target values (3), which are target values of the filter factors over an entire frequency range, with high accuracy from ratios of spectral intensities monitored by the high accuracy spectrum monitor 810 and the spectral shape target values 821. Then, the high accuracy factor target value calculation unit 820 outputs the calculation result to the high accuracy factor calculation unit 400 as the third factors 702. This filter factor target values (3) are illustrated in FIG. 13.

After that, the high accuracy factor calculation unit 400 calculates ratios of the third factors 702 which are the filter factor target values calculated by the high accuracy factor target value calculation unit 820, and the first A factors selected and set by the low accuracy factor calculation unit 300, as illustrated in FIG. 14. In the example of FIG. 14, the factor-LUT-2 is selected as the first A factors.

The high accuracy factor calculation unit 400 causes the first B factors to change gradually and makes a setting with the change so that the first factors 700 eventually become equal to the filter factor target values set to the third factors 702.

Such configuration combining the high accurate spectrum monitor and the calculation of the target values for high accurate factors enables factor setting processing of the frequency domain digital filter 200 to be performed with high accuracy.

As described above, the second exemplary embodiment can also achieve substantially the same effect as that in the first exemplary embodiment. In other words, the factors of the frequency domain digital filter 200 are set at high speed using the simplified spectrum monitor 800 which monitors a spectrum in a simplified manner according to the spectral shape of the input signal, and the factors of the frequency domain digital filter 200 can be set with high accuracy by using the high accuracy spectrum monitor 810 which monitors the spectrum with high accuracy.

(Third Exemplary Embodiment)

Figure 15:
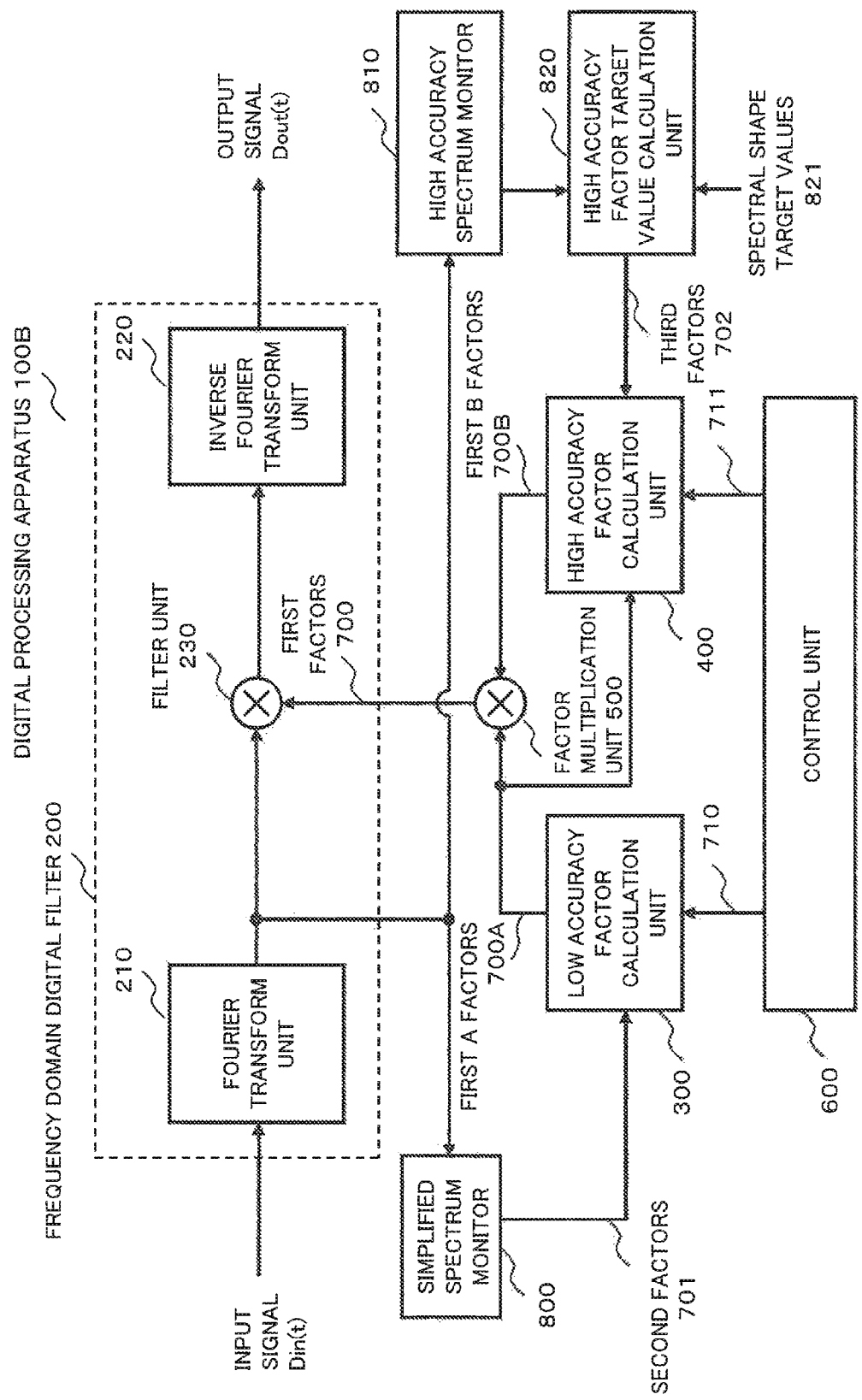
FIG. 15 is a diagram illustrating a configuration of a digital processing apparatus according to a third exemplary embodiment.

FIG. 15 is a diagram illustrating a configuration of a digital processing apparatus 100B according to a third exemplary embodiment. The digital processing apparatus 100B uses a signal after a Fourier transform unit 210 provided in a frequency domain digital filter 200, i.e., a frequency domain signal 201 as input signals of a simplified spectrum monitor 800 and a high accuracy spectrum monitor 810. The other configurations are the same as or similar to those of the digital processing apparatus 100A according to the second exemplary embodiment.

According to the third exemplary embodiment, the configuration of the spectrum monitor can be simplified in comparison with a system which monitors a spectrum using the signal Din(t) in a time domain described in the second exemplary embodiment. This is because the frequency domain signal 201 after Fourier transform represents a momentary spectrum in a certain period (processing unit time of Fourier transform), whereby the spectrum of the input signal Din(t) to the digital processing apparatus 100B can be monitored easily by time-averaging the signals in a frequency domain.

As described above, the digital processing apparatus 100B of the third exemplary embodiment can also achieve substantially the same effect as the digital processing apparatuses 100 and 100A in the first and second exemplary embodiments.

(Fourth Exemplary Embodiment)

Figure 16:
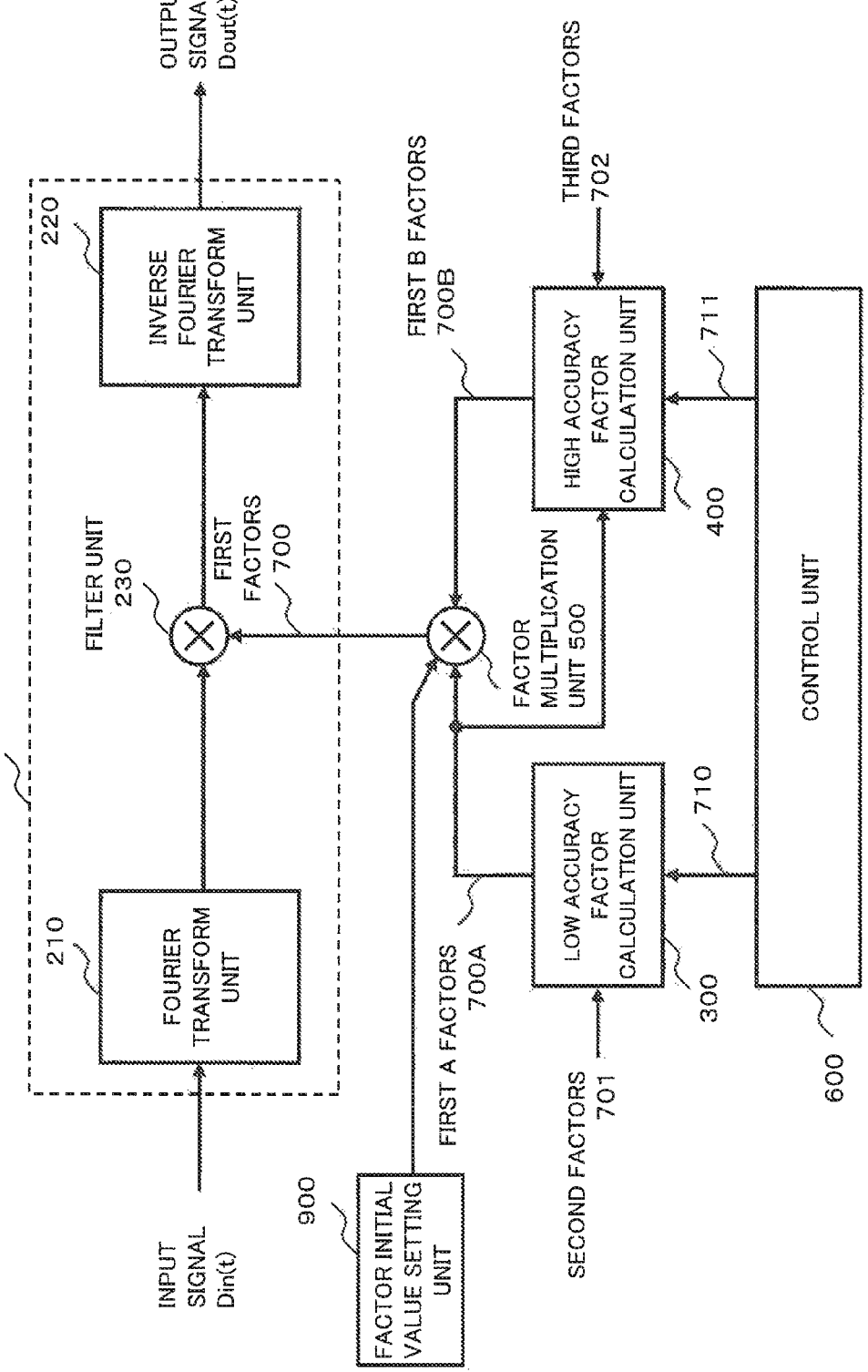
FIG. 16 is a diagram illustrating a configuration of a digital processing apparatus according to a fourth exemplary embodiment.

FIG. 16 is a diagram illustrating a configuration of a digital processing apparatus 100C according to a fourth exemplary embodiment. The digital processing apparatus 100C includes a factor initial value setting unit 900 in addition to the configurations of the digital processing apparatus 100 illustrated in FIG. 1. The factor initial value setting unit 900 stores a fixed factor initial value. Then, a factor multiplication unit 500 multiplies the factor initial value at the time of filter factor control in addition to the first A factors 700A and the first B factors 700B. The configuration of the digital processing apparatus according to the fourth exemplary embodiment is the same as or similar to that of the digital processing apparatus according to the first exemplary embodiment, with the exception that the apparatus includes the factor initial value setting unit 900.

The digital processing apparatus 100C of the fourth exemplary embodiment achieves substantially the same effect as the digital processing apparatuses in the first to third exemplary embodiments. Furthermore, for example, when a known fixed filter factor unique to a communication system can be obtained, the digital processing apparatus 100C of the fourth exemplary embodiment sets the filter factor in the factor initial value setting unit 900 as a factor initial value, thereby making it possible to further simplify the factor calculation processing and achieve filter factor control at higher speed. Note that the factor initial value setting unit 900 may be included in the digital processing apparatuses 100B and 100C of the second and third exemplary embodiments.

(Fifth Exemplary Embodiment)

Figure 17:
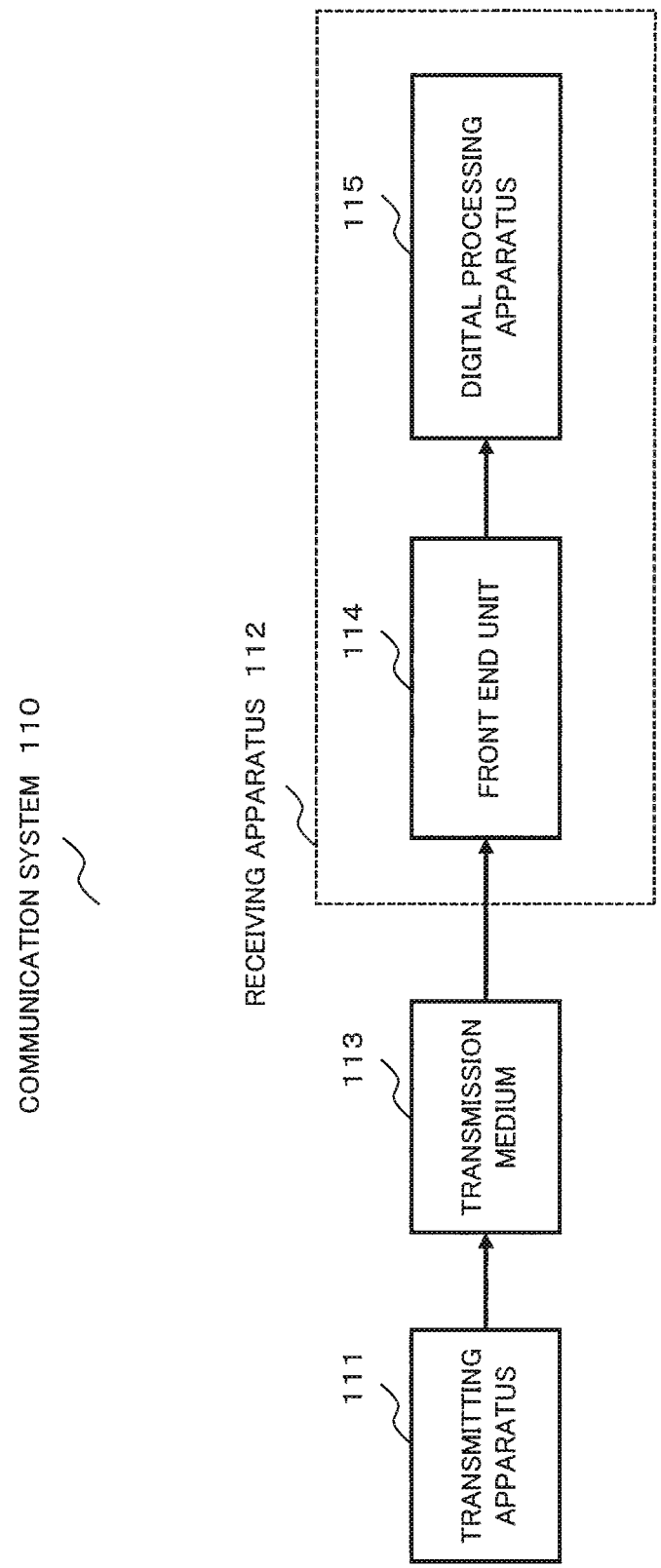
FIG. 17 is a diagram illustrating a communication system using the digital processing apparatus of the present invention.
Figure 18:
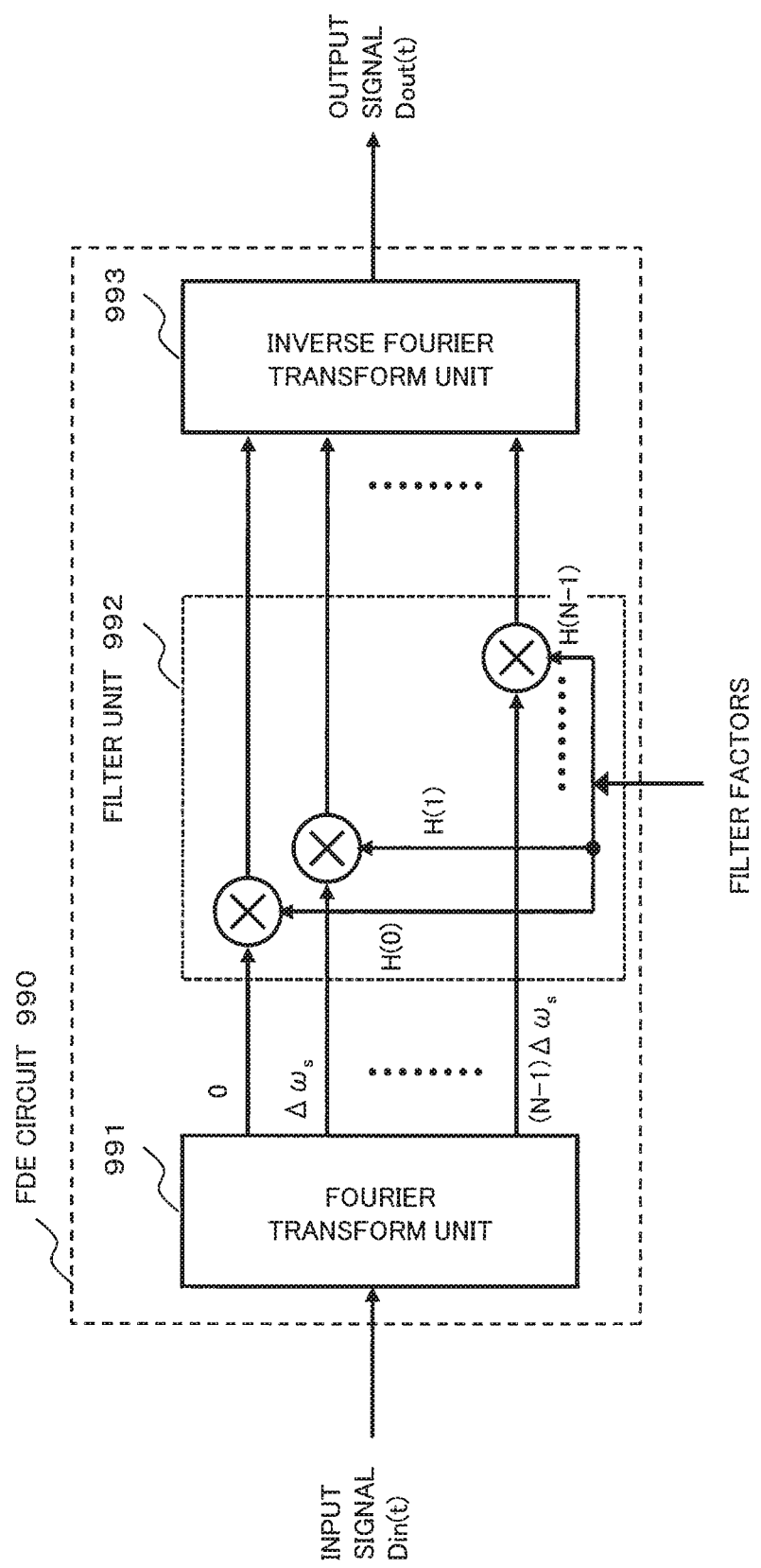
FIG. 18 is a diagram illustrating a configuration of an FDE circuit relevant to the present invention.

FIG. 17 is a diagram illustrating a configuration of a communication system 110 according to a fifth exemplary embodiment. The communication system 110 includes a transmitting apparatus 111 and a receiving apparatus 112. The transmitting apparatus 111 generates a digital signal to transmit the signal to the receiving apparatus 112. A transmission medium 113 is provided between the transmitting apparatus 111 and the receiving apparatus 112. When communication between the transmitting apparatus 111 and the receiving apparatus 112 is performed by wire, the transmission medium 113 is an optical fiber, for example. When communication between the transmitting apparatus 111 and the receiving apparatus 112 is performed by radio, the transmission medium 113 is space.

The receiving apparatus 112 includes a front end unit 114 and a digital processing apparatus 115. The front end unit 114 includes an amplifier which amplifies a signal received through the transmission medium 113, an analog-to-digital converter which converts the amplified signal into a digital signal, and the like. The digital processing apparatus 115 is the digital processing apparatus described in any of the first to fourth exemplary embodiments. The digital processing apparatus 115 performs equalization processing on the input signal which is input from the front end unit 114.

In the communication system 110, for example, when a disconnection in communications such as path switching occurs, only a low accuracy factor calculation unit included in the digital processing apparatus 115 may be activated and first factors may be calculated on the basis of first A factors. During a normal communication, the first factors may be calculated in a state in which both the low accuracy factor calculation unit and a high accuracy factor calculation unit operate. In other words, according to the system conditions, the low accuracy factor calculation unit may be caused to operate to switch filter characteristics at high speed when a great change of factor is required, and the high accuracy factor calculation unit may be caused to operate when a certain degree of loose change and minute factor adjustment are required.

The communication system 110 of the fifth exemplary embodiment can implement a communication system achieving both the feature of filter accuracy and the feature which makes the characteristics of the frequency domain digital filter inside the digital processing apparatus changeable at high speed according to the state of the communication system, such as a change of a state of a transmission medium and switching of a transmission route.

In the above, the present invention is described with reference to the exemplary embodiments, but the invention of the present application is not limited to the above-mentioned exemplary embodiments. Various changes understood by a person skilled in the art can be made to the configuration and detail of the invention of the present application within the scope of the invention of the present application.

For example, in each exemplary embodiment, it is described that the filter unit 230 to which the first factors 700 are set performs equalization processing on the frequency domain signal 201. However, processing performed by the first factors 700 is not limited to the equalization processing. The digital processing apparatus may be an apparatus performing processing on the input signal Din(t) using the first factors.

For example, the simplified spectrum monitor 800 and the high accuracy spectrum monitor 810 in the second and third exemplary embodiments both monitor each spectrum using the signal before filter processing. However, the simplified spectrum monitor 800 and the high accuracy spectrum monitor 810 may monitor the signal after filter processing. In other words, the simplified spectrum monitor 800 and the high accuracy spectrum monitor 810 calculate filter factor target values from a ratio of a spectral shape to be targeted and the spectrum of the signal after filter processing, and set the second factors 701 and the third factors 702, respectively.

The simplified spectrum monitor 800 in the second and third exemplary embodiments monitors two spectral intensities for DC and the frequency fmon. However, the monitored frequency is not limited thereto. In other words, the simplified spectrum monitor 800 may monitor spectra of plural frequency components, and may set plural spectrum monitored results as the second factors 701. For example, factors can be calculated using the plural spectrum monitored results by broken-line-approximation processing (FIG. 10, FIG. 11) as in the second example of the low accuracy factor calculation unit 300 according to the first exemplary embodiment. In this case, processing in the low accuracy factor calculation unit 300 becomes a bit complicated, but the accuracy of the first-A-factors 700A itself calculated by the processing can be improved. In these processes, factor calculation processing time (arithmetic circuit size) and desired accuracy constitutes a trade-off relationship. Therefore, the concrete procedure of processing may be determined according to a system to which the above-mentioned procedure is applied.

The second factors 701 and the third factors 702 are not necessary to be factors set for each frequency. For example, the second factors 701 and the third factors 702 may be set as tap coefficients of an FIR (finite impulse response) filter known as a digital filter in a time domain, and may be converted into N factors set for respective frequencies, the number of which is the same as the first factors 700, by internal processing of each factor calculation unit.

In the second and third exemplary embodiments, the second factors 701 and the third factors 702 are set using spectrum monitors. However, the setting procedure for the second factors 701 and the third factors 702 is not limited thereto. In an optical communications application, influence of wavelength dispersion occurring in an optical fiber which is a transmission medium is dominant. For this reason, for example, if the result of wavelength dispersion monitoring is set as the second factors 701 and the filter factors for compensating the wavelength dispersion under plural conditions as the first A factors 700A are prepared in advance as LUTs, the factor LUT selection unit 310 is only necessary to select the most suitable factor LUT from them.

In a general communication system, a timing extracting unit or a bit determination apparatus including error correction processing is connected to a subsequent stage of the digital processing apparatus of the present invention. In such a case, filter factor target values such that a bit error rate is the minimum may be calculated on the basis of error correction information output from the bit determination apparatus, and may be set as the third factors 702.

The present application claims priority based on Japanese Patent Application No. 2013-182854, filed on Sep. 4, 2013, the entire disclosure of which is incorporated herein.

REFERENCE SIGNS LIST

100, 100A, 100B, 100C, 115 Digital processing apparatus
110 Communication system
111 Transmitting apparatus
112 Receiving apparatus
113 Transmission medium
114 Front end unit
200 Frequency domain digital filter
201, 202 Frequency domain signal
210, 991 Fourier transform unit
220, 993 Inverse Fourier transform unit
230, 992 Filter unit
300 Low accuracy factor calculation unit
301 Simplified factor calculation unit
310 Factor LUT selection unit
320 Factor-LUT group
330 Broken-line-approximation factor calculation unit
400 High accuracy factor calculation unit
410 Factor division unit
420 Factor variable unit
500 Factor multiplication unit
600 Control unit
700 First factors
700A First A factors
700B First B factors
701 Second factors
702 Third factors
710 First control signal
711 Second control signal
800 Simplified spectrum monitor
810 High accuracy spectrum monitor
820 High accuracy factor target value calculation unit
821 Spectral shape target value
900 Factor initial value setting unit
990 FDE circuit

What is claimed is:

1. A digital processing apparatus comprising:
a first circuit that Fourier-transforms a time domain digital signal and generates N frequency domain signals, N being a natural number;
a filter that processes the frequency domain signals in a frequency domain using N first factors;
a second circuit that transforms the N frequency domain signals processed by the filter into a time domain digital signal;
first calculator that calculates N first A factors using m second factors where N>m and m is a natural number;
a second calculator including a divider that calculates respective ratios of N third factors and the N first A factors and a factor variable calculator that calculates N first B factors each varying in a stepwise fashion from 1 to corresponding ratios;
a multiplier that calculates the N first factors by multiplying the first A factor and the first B factor together; and
a controller that controls the first calculator and the second calculator in such a way that the second calculator calculates the first B factors based on the third factors after causing only the first calculator to operate with the first B factors being set to 1.

2. The digital processing apparatus according to claim 1, wherein
the third factor is a target value of a characteristic of the filter, and
the first factor output during an operation of the second calculator is a value closer to the target value than the first factor calculated at a time when only the first calculator operates.

3. The digital processing apparatus according to claim 2, wherein
the first calculator includes:
a plurality of factor look-up tables; and
the factor selector that selects the factor look-up table corresponding to the first A factor from the plurality of factor look-up tables based on the m second factors.

4. The digital processing apparatus according to claim 2, wherein
the first calculator includes the third calculator that calculates the first A factor based on a result of interpolation of a value between a plurality of the second factors.

5. The digital processing apparatus according to claim 2 further comprising:
the first monitor that monitors a spectral intensity of the time domain digital signal or the frequency domain signal at one frequency component or a plurality of frequency components different from each other and sets the second factor based on a monitoring result of the spectral intensity at one frequency component or a plurality of frequency components different from each other;
the second monitor that monitors, as for spectrum of the time domain digital signal, spectral intensities of a plurality of frequency components different from each other, the number of the frequency components being greater than that of the first monitor; and
the fourth calculator that calculates the third factor based on a monitoring result of the second monitor.

6. The digital processing apparatus according to claim 2, further comprising;
the factor initial value setter that sets a fixed filter factor initial value, wherein
the multiplier multiplies the first A factors, the first B factors, and the factor initial value together to set each one of the N first factors.

7. The digital processing apparatus according to claim 2, wherein
the filter equalizes the frequency domain signal in a frequency domain using the first factors.

8. The digital processing apparatus according to claim 1, wherein
the first calculator includes:
a plurality of factor look-up tables; and
a factor selector that selects one factor look-up table corresponding to the first A factor from the plurality of factor look-up tables based on the m second factors.

9. The digital processing apparatus according to claim 8 further comprising:
the first monitor that monitors a spectral intensity of the time domain digital signal or the frequency domain signal at one frequency component or a plurality of frequency components different from each other and sets the second factor based on a monitoring result of the spectral intensity at one frequency component or a plurality of frequency components different from each other;
the second monitor that monitors, as for spectrum of the time domain digital signal, spectral intensities of a plurality of frequency components different from each other, the number of the frequency components being greater than that of the first monitor; and
the fourth calculator that calculates the third factor based on a monitoring result of the second monitor.

10. The digital processing apparatus according to claim 8, further comprising:
the factor initial value setter that sets a fixed filter factor initial value, wherein
the multiplier multiplies the first A factors, the first B factors, and the factor initial value together to set each one of the N first factors.

11. The digital processing apparatus according to claim 1, wherein
the first calculator includes a third calculator that calculates the first A factor based on a result of interpolation of a value between a plurality of the second factors.

12. The digital processing apparatus according to claim 11 further comprising:
the first monitor that monitors a spectral intensity of the time domain digital signal or the frequency domain signal at one frequency component or a plurality of frequency components different from each other and sets the second factor based on a monitoring result of the spectral intensity at one frequency component or a plurality of frequency components different from each other;
the second monitor that monitors, as for spectrum of the time domain digital signal, spectral intensities of a plurality of frequency components different from each other, the number of the frequency components being greater than that of the first monitor; and
the fourth calculator that calculates the third factor based on a monitoring result of the second monitor.

13. The digital processing apparatus according to claim 11, further comprising:
the factor initial value setter that sets a fixed filter factor initial value, wherein
the multiplier multiplies the first A factors, the first B factors, and the factor initial value together to set each one of the N first factors.

14. The digital processing apparatus according to claim 1 further comprising:
a first monitor that monitors a spectral intensity of the time domain digital signal or the frequency domain signal at one frequency component or a plurality of frequency components different from each other and sets the second factor based on a monitoring result of the spectral intensity at one frequency component or a plurality of frequency components different from each other;
a second monitor that monitors, as for spectrum of the time domain digital signal, spectral intensities of a plurality of frequency components different from each other, the number of the frequency components being greater than that of the first monitor; and
a fourth calculator that calculates the third factor based on a monitoring result of the second monitor.

15. The digital processing apparatus according to claim 14, further comprising:
the factor initial value setter that sets a fixed filter factor initial value, wherein
the multiplier multiplies the first A factors, the first B factors, and the factor initial value together to set each one of the N first factors.

16. The digital processing apparatus according to claim 1, further comprising:
a factor initial value setter that sets a fixed filter factor initial value, wherein
the multiplier multiplies the first A factors, the first B factors, and the factor initial value together to set each one of the N first factors.

17. The digital processing apparatus according to claim 1, wherein
the filter equalizes the frequency domain signal in a frequency domain using the first factors.

18. A communication system comprising:

a transmitter that transmits a digital signal; and a receiver including a front end that receives the digital signal, and the digital processing apparatus according to claim 1 into which a signal output from the front end is input.

19. A digital processing method comprising:

generating N frequency domain signals, N being a natural number by Fourier-transforming a time domain digital signal;

processing the N frequency domain signals in frequency domain using N first factors;

transforming the N frequency domain signals processed into a time domain digital signal;

calculating N first A factors using m second factors where N>m and m is a natural number;

calculating respective ratios of N third factors and the N first A factors;

calculating N first B factors each varying in a stepwise fashion from 1 to the corresponding ratio; and calculating the first A factors as the first factors and thereafter, calculating the first factors by multiplying the first A factor and the first B factor together based on the third factors.

20. A digital processing apparatus comprising:

Fourier transform means for Fourier-transforming a time domain digital signal and generating N frequency domain signals, N being a natural number;

filter means for processing the N frequency domain signals in frequency domain using N first factors;

inverse Fourier transform means for transforming the frequency domain signals processed by the filter means into a time domain digital signal;

low accuracy factor calculation means for calculating N first A factors using m second factors where N>m and m is a natural number;

high accuracy factor calculation means including factor division means for calculating respective ratios of N third factors and the N first A factors and factor variable means for calculating N first B factors each varying in a stepwise fashion from 1 to corresponding ratios;

multiplication means for calculating the N first factors by multiplying the first A factor and the first B factor together; and control means for controlling the low accuracy factor calculation means and the high accuracy factor calculation means in such a way that the high accuracy factor calculation means calculates the first B factors based on the third factors after causing only the low accuracy factor calculation means to operate with the first B factors being set to 1.

* * * * *